US010990647B2

(12) United States Patent
Peterson

(10) Patent No.: US 10,990,647 B2
(45) Date of Patent: Apr. 27, 2021

(54) FLEXIBLE VECTOR-PROCESSING ALGORITHMS FOR NUMERICALLY SOLVING EXTREME-SCALE, LINEAR AND NON-LINEAR, PREDICTIVE AND PRESCRIPTIVE, PROBLEMS IN SCIENCE AND ENGINEERING, ON PARALLEL-PROCESSING SUPER COMPUTERS

(71) Applicant: Elmor L. Peterson, Raleigh, NC (US)

(72) Inventor: Elmor L. Peterson, Raleigh, NC (US)

( * ) Notice: Subject to any disclaimer, the term of this patent is extended or adjusted under 35 U.S.C. 154(b) by 0 days.

(21) Appl. No.: 16/436,860

(22) Filed: Jun. 10, 2019

(65) Prior Publication Data

US 2019/0311306 A1     Oct. 10, 2019

Related U.S. Application Data

(63) Continuation-in-part of application No. 15/282,682, filed on Sep. 30, 2016, now abandoned, which is a continuation-in-part of application No. PCT/US2015/023734, filed on Mar. 31, 2015.

(60) Provisional application No. 61/973,232, filed on Mar. 31, 2014.

(51) Int. Cl.
| | | |
|---|---|---|
| *G06F 17/12* | (2006.01) | |
| *G06F 9/30* | (2018.01) | |
| *G06F 9/38* | (2018.01) | |
| *G06N 7/00* | (2006.01) | |
| *G06N 7/02* | (2006.01) | |
| *G06Q 10/04* | (2012.01) | |
| *G06F 17/11* | (2006.01) | |
| *G06Q 30/02* | (2012.01) | |
| *G06F 17/16* | (2006.01) | |
| *G06F 30/00* | (2020.01) | |
| *G06F 30/30* | (2020.01) | |

(52) U.S. Cl.
CPC .......... *G06F 17/12* (2013.01); *G06F 9/30036* (2013.01); *G06F 9/3877* (2013.01); *G06F 17/11* (2013.01); *G06F 17/16* (2013.01); *G06N 7/005* (2013.01); *G06N 7/02* (2013.01); *G06Q 10/04* (2013.01); *G06Q 30/02* (2013.01); *G06F 30/00* (2020.01); *G06F 30/30* (2020.01); *G06F 2009/3883* (2013.01)

(58) Field of Classification Search
CPC ........ G06F 17/11; G06F 12/16; G06F 9/3877; G06F 9/30036; G06N 7/02; G06N 7/005
See application file for complete search history.

(56) References Cited

U.S. PATENT DOCUMENTS

| | | | |
|---|---|---|---|
| 6,954,921 B2 * | 10/2005 | Hassibi | ................... G06F 30/36 716/103 |
| 7,072,723 B2 | 7/2006 | Kohn et al. | |
| 8,121,818 B2 | 2/2012 | Gorinevsky | |
| 8,855,987 B2 | 10/2014 | Imhof et al. | |
| 9,400,491 B2 * | 7/2016 | Kolinsky | ............... G05B 13/04 |
| 9,448,546 B2 | 9/2016 | Sayyarrodsari et al. | |
| 2003/0220772 A1 | 11/2003 | Chiang et al. | |

FOREIGN PATENT DOCUMENTS

WO          03088096 A2     10/2003

OTHER PUBLICATIONS

Boyd, S., et al., "Convex Optimization", Mar. 15, 1999, Publisher: Cambridge University Press.
Peterson, E.L., "An Economic Interpretation of Duality in Linear Programming", "Journal of Mathematical Analysis and Applications", 1970, pp. 172-196, vol. 30, No. 1.
Zhang, S., "A New Self-Dual Embedding Method for Convex Programming", "Journal of Global Optimization", Oct. 26, 2001, pp. 1-18.

* cited by examiner

*Primary Examiner* — Michael D. Yaary
(74) *Attorney, Agent, or Firm* — Hultquist, PLLC; Steven J. Hultquist

(57) ABSTRACT

A computer-implemented method for numerical solution of a geometric programming problem is described, including the computer-implemented steps of: reformulating the geometric programming problem as an equivalent generalized geometric programming optimization problem with only linear constraints, and solving the equivalent generalized geometric programming optimization problem by vector processing, including determining by computer-implemented numerical computation a solution for an unconstrained objective function whose independent vector variable is the generalized geometric programming conjugate dual of a primal decision vector variable of the geometric programming problem, and includes a variable linear combination of fixed vectors enabling the vector processing. Also described are computer-readable storage devices, computer program products, and computer systems for such numerical solution methodology.

23 Claims, No Drawings

FLEXIBLE VECTOR-PROCESSING ALGORITHMS FOR NUMERICALLY SOLVING EXTREME-SCALE, LINEAR AND NON-LINEAR, PREDICTIVE AND PRESCRIPTIVE, PROBLEMS IN SCIENCE AND ENGINEERING, ON PARALLEL-PROCESSING SUPER COMPUTERS

CROSS-REFERENCE TO RELATED APPLICATIONS

This is a continuation-in-part application under 35 U.S.C. 120 of U.S. patent application Ser. No. 15/282,682 filed Sep. 30, 2016, which in turn is a continuation-in-part application under 35 U.S.C. § 120 of International Patent Application No. PCT/US2015/023734 filed on Mar. 31, 2015, which in turn claims the benefit of U.S. Provisional Patent Application No. 61/973,232 filed on Mar. 31, 2014 in the name of Elmor L. Peterson for "FLEXIBLE VECTOR-PROCESSING ALGORITHMS FOR NUMERICALLY SOLVING EXTREME-SCALE, LINEAR AND NON-LINEAR, PREDICTIVE AND PRESCRIPTIVE, PROBLEMS IN SCIENCE AND ENGINEERING, ON PARALLEL-PROCESSING SUPER COMPUTERS". The disclosures of U.S. patent application Ser. No. 15/282,682, International Patent Application No. PCT/US2015/023734, and U.S. Provisional Patent Application No. 61/973,232 are hereby incorporated by reference herein in their respective entireties, for all purposes.

FIELD

The present disclosure relates to new vector parallel-processing algorithms for numerically solving extreme-scale scientific and engineering problems not currently solvable in real time by previous algorithms whose computational complexity has been too high due to their inability to exploit modern parallel-processing super computers. These new algorithms utilize recent discoveries about the underlying signature characteristics of generalized geometric programming, a field that has been evolving for 50 years with the assistance of the present inventor.

DESCRIPTION OF THE RELATED ART

In the 1960s, commercial electrical power distribution networks had sufficiently increased in scope and complexity to require electric utility companies to custom design and fabricate large-scale power-distribution transformers that would satisfy industrial and residential power demands.

At that time, new mathematical formulations were developed for generalized-polynomial objective and constraint functions to achieve transformer models that provided minimum combined fabrication and expected life-time operating costs. This development, involving the efforts of Clarence M. Zener, Richard J. Duffin, and Elmor L. Peterson, gave rise to the field of field of geometric programming, and a seminal text, "Geometric programming—theory and application," R. J. Duffin, E. L. Peterson, and C. M. Zener, John Wiley & Sons, Inc., New York-London-Sydney, 1967.

Geometric programming was subsequently embraced by the engineering design and construction industry, with such early successes as the design and construction by Bechtel Corporation of the national water storage and distribution system of Algeria in 1979, in which geometric programming modeling of the system was attributed as achieving cost savings, in relation to prior conventional design approaches, on the order of $50 million (equal to approximately $150 million in current U.S. dollars).

At present, geometric programming modeling and techniques are widely used in a variety of fields to optimally design and operate systems and their components, and commercial computer software programs implementing geometric programming modeling are readily available from a variety of vendors, including the MOSEK optimization software commercially available from Mosek ApS (Copenhagen, Denmark) for solving general convex nonlinear problems, conic quadratic problems, and semidefinite problems involving positive semidefinite matrix variables, among others, and Mosek ApS's optimization toolbox for MATLAB. Examples of current use of geometric programming techniques include optimal design of electronic microprocessors and integrated circuitry.

As a discipline, geometric programming has enabled reformulation and subsequent transformation (via geometric programming "conjugate duality" techniques) of the widely used "Shannon Information Theory" as well as Boltzmann thermodynamics and statistical mechanics in which entropy optimization is utilized to infer the least biased probability distribution underlying a particular statistical information.

Despite its substantial success, the utility of existing geometric programming techniques has been limited to moderate- and large-scale problems involving up to tens of thousands of decision variables, but its implementation for solution of extreme-scale (sometimes referred to as exa-scale or multi-scale) problems involving millions and even the billions of decision variables has not been practically achieved.

SUMMARY

The present disclosure relates to parallel processing computer systems and parallel processing computer-implemented methods for numerical solution by flexible vector-processing algorithms, affording capability for numerical solution of extreme-scale geometric programming problems.

The present disclosure reflects the discovery of hidden properties of linearity, convexity, and separability found to be present in all geometric programming problems, and the correlative development of qualitative and quantitative exploitations of such hidden properties, involving uncovering, reformulation, and transformation of such hidden properties in unexpected and surprisingly effective ways.

In one aspect, the present disclosure relates to a computer-implemented method for numerical solution of a geometric programming problem, comprising the computer-implemented steps of:

reformulating the geometric programming problem as an equivalent generalized geometric programming optimization problem with only linear constraints, and solving the equivalent generalized geometric programming optimization problem by vector processing, comprising determining by computer-implemented numerical computation a solution for an unconstrained objective function whose independent vector variable is the generalized geometric programming conjugate dual of a primal decision vector variable of the geometric programming problem, and comprises a variable linear combination of fixed vectors enabling the vector processing.

In another aspect, the disclosure relates to a computer-readable storage device embodying a non-transitory program of machine-readable instructions executable by a digital processing apparatus to perform a method of numerical solution of a geometric programming problem, the method comprising:

reformulating the geometric programming problem as an equivalent generalized geometric programming optimization problem with only linear constraints, and solving the equivalent generalized geometric programming optimization problem by vector processing, comprising determining by computer-implemented numerical computation a solution for an unconstrained objective function whose independent vector variable is the generalized geometric programming conjugate dual of a primal decision vector variable of the geometric programming problem, and comprises a variable linear combination of fixed vectors enabling the vector processing.

In a further aspect, the disclosure relates to a computer program product comprising a computer program embodied in a tangible, computer-readable medium, for enabling numerical solution of a geometric programming problem, the computer program comprising:

instructions for reformulating the geometric programming problem as an equivalent generalized geometric programming optimization problem with only linear constraints, and instructions for solving the equivalent generalized geometric programming optimization problem by vector processing, comprising instructions for determining by computer-implemented numerical computation a solution for an unconstrained objective function whose independent vector variable is the generalized geometric programming conjugate dual of a primal decision vector variable of the geometric programming problem, and comprises a variable linear combination of fixed vectors enabling the vector processing.

A still further aspect of the disclosure relates to a computer system comprising a memory and parallel processors that are programmatically adapted by the above-described computer program product to generate the numerical solution of the geometric programming problem.

Yet another aspect of the disclosure relates to a computer-implemented method for generating a solution output on a graphical user interface or other output component of a programmed vector parallel-processing computer to a mixed integer linearly constrained convex programming (MILCCP) application, wherein the programmed vector parallel-processing computer is programmed to reduce the MILCCP application to an unconstrained convex programming application, and wherein said method comprises automatic operation of the programmed vector parallel-processing computer to reformulate the MILCCP application as an equivalent convex generalized geometric programming (GGP) problem whose corresponding conjugate dual problem is unconstrained, and automatic operation of the programmed computer to solve the GGP problem with an unconstrained convex programming algorithm, by vector parallel-processing.

Additional aspects of the disclosure relate to a programmed vector parallel-processing computer programmed to carry out such method, and computer-readable media and processors containing instructions for carrying out such method in a vector parallel-processing computer.

Other aspects, features and embodiments of the disclosure will be more fully apparent from the ensuing description and appended claims.

DETAILED DESCRIPTION

The present disclosure relates to parallel processing computer systems and computer-implemented parallel processing methods for solution of heretofore unsolvable extreme-scale geometric programming problems.

As used herein, the singular forms "a", "an" and "the" are intended to include the plural forms as well, unless the context clearly indicates otherwise. It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As discussed hereinabove, the present disclosure is based on the discovery that hidden properties of linearity, convexity, and separability are ubiquitous in geometric programming problems, and the resulting capability to develop exploitations by uncovering, reformulating, and transforming these hidden properties to achieve numerical solutions and optimal design of extreme-scale systems and their components.

In one aspect, the present disclosure relates to a computer-implemented method for numerical solution of a geometric programming problem, comprising the computer-implemented steps of:

reformulating the geometric programming problem as an equivalent generalized geometric programming optimization problem with only linear constraints, and solving the equivalent generalized geometric programming optimization problem by vector processing, comprising determining by computer-implemented numerical computation a solution for an unconstrained objective function whose independent vector variable is the generalized geometric programming conjugate dual of a primal decision vector variable of the geometric programming problem, and comprises a variable linear combination of fixed vectors enabling the vector processing.

In such method, the geometric programming problem, i.e., primal problem, may be of any suitable type, and may for example comprise at least one of design, modeling, and optimization of a system, e.g., an exa-scale system. In various embodiments, the geometric programming problem may comprise a stochastic linear programming optimization problem. Specific examples of geometric programming problems susceptible to solution by the methodology of the present disclosure include multi-scale climate modeling, modeling of controlled nuclear fusion, and the design, optimization, and modeling applications disclosed hereinafter. Specific geometric programming problems amenable to solution by the method of the present disclosure include problems such as economic equilibration, physical equilibration, profit maximization, and cost minimization.

The numerical solution methodology of the present disclosure is more fully described hereinafter, and may for example comprise convex optimization of a non-convex primal geometric programming problem. The methodology may comprise Rockafellar bi-function programming, fuzzy optimization techniques, and other geometric programming approaches. In various embodiments, the methodology is conducted to produce an optimal solution that is used to solve a deterministic primal problem of the geometric programming problem by a linear programming technique.

The computer-implemented steps of the method of the present disclosure may be conducted on a parallel processing computer, e.g., a massively parallel supercomputer.

The methodology of the present disclosure can be implemented using a suitable programmably configured parallel-processing super computer. The parallel-processing super computer may be of any suitable type that is constructed, arranged, and programmed to perform flexible vector-processing algorithms for numerically solving extreme-scale, linear and non-linear, predictive and prescriptive, problems in accordance with the present disclosure.

In various embodiments, the parallel-processing super computer may comprise a massively parallel vector processing computer of a type as described in U.S. Pat. No. 4,891,751 issued Jan. 2, 1990 to Duane B. Call et al. Such massively parallel vector computer comprises a set of vector processing nodes, each including a main processor and a main random access memory (RAM) connected to an internal bus, with each node also including a vector memory and a programmable vector processor connected to a local bus, and the local and internal busses communicating via a local interface port controlled by the main processor.

In other embodiments, the parallel-processing super computer may comprise an ultrascalable petaflop parallel supercomputer as described in U.S. Pat. No. 7,761,687 issued Jul. 20, 2010 to Matthias A. Blumrich, et al., in which the super computer includes node architectures based upon system-on-a-chip technology, where each processing node comprises a single application specific integrated circuit and nodes are interconnected by multiple independent networks that optimally maximize the throughput of packet communications between nodes with minimal latency. The multiple networks may include high-speed networks for parallel algorithm message passing, with the multiple independent networks being collaboratively or independently utilized according to the needs or phases of an algorithm for optimizing algorithm processing performance.

The disclosure contemplates as an additional aspect of the technology described herein, a computer-readable storage device embodying a non-transitory program of machine-readable instructions executable by a digital processing apparatus to perform a method of numerical solution of a geometric programming problem, wherein the method comprises:

reformulating the geometric programming problem as an equivalent generalized geometric programming optimization problem with only linear constraints, and solving the equivalent generalized geometric programming optimization problem by vector processing, comprising determining by computer-implemented numerical computation a solution for an unconstrained objective function whose independent vector variable is the generalized geometric programming conjugate dual of a primal decision vector variable of the geometric programming problem, and comprises a variable linear combination of fixed vectors enabling the vector processing.

The computer-readable storage device may be of any suitable type, and may for example comprise a device selected from the group consisting of random access memory, magnetic data storage diskettes, CD discs, hard drives, RAID arrays, magnetic tape, electronic read-only memory, and optical storage devices.

In a further aspect, the disclosure relates to a computer program product comprising a computer program for enabling numerical solution of a geometric programming problem. Such computer program comprises:

instructions for reformulating the geometric programming problem as an equivalent generalized geometric programming optimization problem with only linear constraints, and instructions for solving the equivalent generalized geometric programming optimization problem by vector processing, comprising instructions for determining by computer-implemented numerical computation a solution for an unconstrained objective function whose independent vector variable is the generalized geometric programming conjugate dual of a primal decision vector variable of the geometric programming problem, and comprises a variable linear combination of fixed vectors enabling the vector processing.

Another aspect of the disclosure relates to a computer system comprising a memory and parallel processors that are programmatically adapted by the computer program product of the present disclosure, as described above, to generate the numerical solution of the geometric programming problem. Such computer system thus may be adapted to generate the numerical solution of a geometric programming problem comprising at least one of design, modeling, and optimization of an exa-scale system, e.g., a stochastic linear programming optimization problem.

The systems and methodology of the present disclosure enable numerical solution of previously unsolvable extreme-scale geometric programming problems, by use of flexible vector-processing algorithms. These vector-processing algorithms derive from the conjugate duality of generalized geometric programming (GGP), each of whose optimization problems, including those with nonlinear constraints, is reformulated as an equivalent GGP optimization problem with only linear constraints, by highly effective non-trivial transformations.

For ease of description, these algorithms will initially be described in the relatively simple context of linearly constrained GGP. Since linear programming (LP) is the simplest form of this relatively simple GGP programming type, it will be readily apparent that the algorithms of the present disclosure are ideally suited to solving, in real time, many extreme-scale LP optimization problems that have heretofore resisted solution by previous LP algorithms as a result of their inherently high computational complexity.

The new GGP algorithms of the present disclosure have the potential to replace all currently employed numerical linear-algebraic algorithms for solving general extreme-scale linear systems, viz., systems containing only linear equations and/or linear inequalities. The solution methodologies of the present disclosure achieve a substantial advance in the art, since they require only the numerical computation of a critical solution for an unconstrained objective function whose independent vector variable (essentially a GGP conjugate dual of the given (primal) decision vector variable) is a variable linear combination of appropriate fixed vectors, thereby enabling elementary vector processing to be employed.

For the resulting LP and numerical linear-algebraic algorithms, the GGP conjugate dual and primal objective functions for each individual LP optimization problem or linear system problem can be chosen from an infinite number of candidate functions, in which the selection is made to further simplify the vector parallel processing and/or exploit any special system structure, e.g., matrix sparsity.

Such infinite flexibility renders the solution methodologies of the present disclosure substantially more general in character than previously developed iterative solution methodologies for solving large-scale linear systems, such as interior point methodologies that have been developed for linear programming, and conjugate-gradient methods for symmetric positive-definite systems of linear equations, which are limited in application to a very narrow class of linear equations with no inequalities. The flexibility of the solution methodologies of the present disclosure makes such methodologies suitable for robust numerical solution of previously unsolvable general stochastic LP optimization problems and linear systems problems with uncertainty.

The disclosure hereinafter provides a brief overview of fundamentals and basic theory of GGP, within the familiar context of linear algebra and elementary multi-variable differential calculus, by way of background to the subsequent discussion of the vector processing systems and methods of the present disclosure. The uncovering, reformulating, and transforming of the signature characteristics of linearity, convexity, and separability, as utilized in the systems and methods of the present disclosure, will also be illustrated using elementary differential calculus and introductory linear algebra.

GGP, although developed for general nonlinear optimization, is addressed below in connection with new solution methodologies for general linear systems, as providing (i) vector processing, not available in previously developed methodologies such as interior-point methodologies for linear programming, for solving linear systems containing only linear equations and/or linear inequalities, and (ii) complete closed-form solutions to uncertainty problems for general linear systems, including distribution and robust problems for stochastic LP, using vector processing.

Considering general linear systems, solution methodologies for equations of the following type:

Given $A \in \Re^{m \times n}$ and $b \in \Re^m$, solve $A\chi = b$ for $\chi \in \Re^n$ include approaches such as Gaussian pivoting and related methodologies, and the Hestenes-Lanczos-Stiefel conjugate-gradient method.

The Gaussian pivoting method with [A|b] entails no requirement as a constraint on A, and is known to provide exact solutions, if they exist, when using exact arithmetic, with cubic computational complexity. Nonetheless, any early termination, as is frequently needed for large-scale systems, generally results in no usable approximate solution.

Using the Hestenes-Lanczos-Stiefel conjugate-gradient method requires m to be equal to n, and requires A to be both symmetric and positive definite. This approach minimizes $(1/2)\chi^T A\chi - b^T \chi$ for $\chi \in \Re^n$ via conjugate-gradient iterations, an extremely efficient refinement of steepest-descent iterations technique that is valid for strictly convex quadratic minimization, but possibly no other type of optimization. The optimal solutions of such conjugate-gradient iterations methodology automatically satisfy the first-order optimality condition $A\chi - b = 0$ and hence $A\chi = b$. The Hestenes-Lanczos-Stiefel conjugate-gradient method is known to provide an exact solution, which always exists and is unique, when using exact arithmetic, with only n conjugate-gradient iterations. Any early termination necessitated by application to large-scale systems will frequently result in a usable approximate solution whose accuracy is easily determined at the end of each iteration. The Hestenes-Lanczos-Stiefel conjugate-gradient method is also known to provide super-linear convergence when using finite-precision arithmetic.

In contrast to the foregoing techniques, the new GGP methodologies of the present disclosure involve no requirement on A. Since the most general geometric programming problem required to completely treat the general equality system $A\chi = b$ needs to be defined in terms of general orthogonal complementary subspaces, reformulating the system $A\chi = b$ in a homogenous format as $A\chi - b = 0$ suggests using the slightly modified augmented matrix [A|−b] along with its null space $$X = \{x \in \Re^{n+1} | [A|-b]x = 0\}$$

and its row space $$Y = \{y \in \Re^{n+1} | y^T = z^T [A|-b] \text{ for some } z \in \Re^m\},$$

which are orthogonal complementary subspaces in $\Re^{n+1}$. Since each vector x in this null space X that has a non-zero $(n+1)^{th}$ component $x_{n+1}$ clearly provides a solution $\chi$ to $A\chi - b = 0$ that is simply the first n components of $x/x_{n+1}$, it seems appropriate for this null space X to be used in the definition of the relevant primal generalized geometric programming problem, while the corresponding row space Y is used in the definition of a corresponding dual generalized geometric programming problem, namely, the extremely general (optimization-like) equilibrium problem.

The following dual GGP problem Q is next considered: given an arbitrary real-valued function h:D with a nonempty domain $D \subseteq \Re^{n+1}$ (and with a value h(y) for each $y \in D$), compute all critical points, if any, for the resulting composite function f:F whose domain $$F = \{z \in \Re^m | z^T [A|-b] = y^T \text{ for some } y \in D\}$$

and whose value $$f(z) = h(y) \text{ when } y^T = z^T[A|-b] \text{ for some } z \in F,$$

wherein the key computation of $y^T$ from $z^T$ can be efficiently accelerated with the aid of vector parallel-processing.

The relevance of this dual GGP problem Q to providing solutions to the primal equality system $A\chi - b = 0$ is an immediate consequence of the following observation. If problem Q is consistent, i.e., if its feasible solution set F is not empty because $Y \cap D$ is not empty, and if it has a critical solution $z_{cr}$ whose image $y_{cr}^T = z_{cr}^T[A|-b]$ is an interior point of D at which h is differentiable, then the chain rule implies that $$[A|-b]\nabla h(y_{cr}) = 0$$

and hence that $\nabla h(y_{cr})$ is in the null space of [A|−b]. If, in addition, $\nabla h(y_{cr})$ has a non-zero $(n+1)^{th}$ component (that is, if the $(n+1)^{th}$ partial derivative $h_{n+1}(y_{cr}) \neq 0$), then the first n components of $\nabla h(y_{cr})/h_{n+1}(y_{cr})$ clearly provide a solution $\chi$ to $A\chi - b = 0$.

The scope of this observation can be greatly enlarged by replacing the differentiability assumption about h:D at a critical solution $y_{cr}$ with a generalized differentiability assumption about h:D at $y_{cr}$ using the non-smooth analysis of Clarke, but such extra flexibility requires substantially more sophisticated analyses. Instead, a simpler approach is taken to ensure, without much loss of generality, the automatic satisfaction of the key secondary assumption, $h_{n+1}(y_{cr}) \neq 0$, in this observation. This is done by restricting the general form of the function h:D in problem Q to the special partially separable form $$D = \bar{D} \times \Re$$

with $$(y_1, \ldots, y_n) = \bar{y} \in \bar{D} \text{ and } y_{n+1} \in \Re,$$

where $\bar{D} \subseteq \Re^n$ is the nonempty domain for some arbitrary real-valued function $\bar{h}:\bar{D}$ for which $$h(y) = \bar{h}(\bar{y}) + y_{n+1}.$$

In particular, since $h_{n+1}(y_{cr})$ is then identically one, $h_{n+1}(y_{cr}) \neq 0$ and the solution $\chi$ to $A\chi - b = 0$ consisting of the first n components of $\nabla h(y_{cr})/h_{n+1}(y_{cr})$ is now just $\nabla \bar{h}(\bar{y}_{cr})$ where $\bar{y}_{cr}$ is simply the first n components of $y_{cr}$.

The following examples are provided.

EXAMPLE 1

Choosing $\bar{D} = \Re^n$ and $\bar{h}(\bar{y}) = (1/2)\{\Sigma_1^n y_j^2\}$ in the contracted version h:D of h:D implies that $\nabla \bar{h}(\bar{y}) = (y_1, y_2, \ldots, y_n)^T$ is a solution $\chi$ to $A\chi-b=0$ when $y=y_{cr}$, which must be an optimal solution to the convex quadratic minimization problem Minimize $(1/2)(z^TA)(z^TA)^T-z^Tb$ for $z\in\Re^m$ or, equivalently, Minimize $(1/2)z^T(AA^T)z-b^Tz$ for $z\in\Re^m$.

This problem, which is termed GMRES in the literature, is solvable via the conjugate-gradient algorithm when A has full row rank, but is likely best solved by other linear-algebraic methodology because any sparsity of A might be absent in $AA^T$. The vector parallel-processing of the computation of $y^T$ from $z^T$ in this GGP Problem Q is enhanced by the completely separable form of this example function h:D, thereby establishing that GGP is clearly the superior methodology.

EXAMPLE 2

Choosing $D=\Re^n$ and h(y) to be a constant in the context of a system $A\chi-b=0$ known to have a non-zero solution $\chi$ shows that solutions $\chi$ cannot always be produced by a solution $y_{cr}$ of the dual GPP Problem Q (because $\nabla h(y_{cr})=0$), unless h:D is carefully selected.

In particular, functions h:D that are guaranteed to produce at least one solution $\chi$ to every system $A\chi-b=0$ that has a solution are most easily described in terms of the conjugate transform g:C of the expanded version h:D of a given function h:D, wherein $C=\{x\in\Re^{n+1}|\sup_{y\in D}[x^Ty-h(y)]<+\infty\}$ and $g(x)=\sup_{y\in D}[x^Ty-h(y)]$ for $x\in C$.

Such functions g:C and h:D are called "conjugate functions" because h:D is also the conjugate transform of g:C when h:D is closed and convex, a non-obvious symmetry that seems plausible because of the symmetry of the conjugate inequality $x^Ty\leq g(x)+h(y)$ for each $x\in C$ and each $y\in D$, which is an elementary consequence of the preceding definition of g:C in terms of h:D.

Now, a non-obvious fact derivable from GGP duality theory is that those closed convex functions h:D for which the origin $0\in$ (interior D), and that also have a conjugate transform g:C for which $C=\Re^n\times\{1\}$, are guaranteed to produce at least one solution x to every system $A\chi-b=0$ that has a solution.

EXAMPLE 3

Choosing, as in the previous example, $D=\Re^{n+1}$ and $h(y)=(1/2)\{\Sigma_1^n y_i^2\}+y_{n+1}$ implies, by differential calculus and the complete separation of h:D, that $C=\Re^n\times\{1\}$ and $g(x)=(1/2)\{\Sigma_1^n x_i^2\}+0$ and hence that this GGP approach produces at least one solution $\chi$ to every system $A\chi-b=0$ that has a solution.

Since there are infinitely many choices of closed convex functions h:D for which $0\in$ (int D), and for which $C=\Re^n\times\{1\}$, there are infinitely many GGP dual variational principles that can be used to solve a given system $A\chi-b=0$, all of which use vector parallel-processing of the computation of $y^T$ from $z^T$. Considering the GP duality theory discussed above, it is noted that the conjugate inequality derived above clearly implies the duality inequality $0\leq g(x)+h(y)$ for each $x\in X\cap C$ and each $y\in Y\cap D$, because X and Y are orthogonal complementary subspaces in $\Re^{n+1}$. This inequality expresses the main part of the weak duality theorem for the following pair of generalized geometric programming dual problems:

Primal GGP Problem P:
Compute both the primal infimum $\varphi=\inf_{x\in X\cap C}g(x)$ and the primal optimal solution set $S^*=\{x|x\in X\cap C$ and $g(x)=\varphi\}$.

Dual GGP Problem Q:
Compute both the dual infimum $\psi=\inf_{y\in Y\cap D}h(y)$ and the dual optimal solution set $T^*=\{y|y\in Y\cap D$ and $h(y)=\psi\}$.

The strong duality theorem for generalized geometric programming specialized to, and tailored for, the dual variational principles described herein is set out in the following Key Theorem.

Key Theorem

Given that $0\in$ (int D), Problem Q is always super consistent, but is bounded if, and only if, the system $A\chi-b=0$ has a solution $\chi$. Given also that $C=\Re^n\times\{1\}$, the system $A\chi-b=0$ has a solution $\chi$ if, and only if, Problem P is consistent; in which case Problem Q has a non-empty optimal solution set $T^*$, and there is a solution $\chi^*$ to the system $A\chi-b=0$ that is a subgradient of h(y) at $y=y^*$ for some $y^*$ in $T^*$, with this subgradient $\chi^*$ simply being the gradient $\nabla h(y^*)$ when h(y) is differentiable at that $y=y^*$. Moreover, each such solution $\chi^*$ minimizes $g(\chi)$ over the set of all solutions $\chi$ to the system $A\chi-b=0$.

By virtue of the theory of dual polyhedral (finitely generated) cones and a much more general duality theory of generalized geometric programming, essentially the same dual variational principles are valid when the $i^{th}$ equation $a_i\chi-b_i=0$ in $A\chi-b=0$ is replaced in the definition of X by the inequality $a_i\chi-b_i\geq 0$, provided that the $i^{th}$ row $[a_i|-b_i]$ in $[A|-b]$ is multiplied by a non-negative scalar variable $z_i\geq 0$ when defining Y as a linear combination of the rows of $[A|-b]$.

Consequently, since a general linear optimization problem can always be solved to within any given absolute accuracy $\varepsilon\geq 0$ simply by solving a linear system consisting of the linear primal and dual feasibility conditions along with the condition that the algebraic difference between the linear primal and dual objective functions does not exceed the given $\varepsilon$, this general duality methodology applies to all linear optimization problems, including, most importantly, extra-large scale problems.

Addressing now issues of uncertainty in solving systems of linear equations, for the system Given $A\in\Re^{m\times n}$ and $b\in\Re^m$, solve $A\chi=b$ for $\chi\in\Re^n$, consider A to be arbitrary but fixed, while b is uncertain and hence stochastically confined to the sample space $\Omega=\Re^m$. For this sample space $\Sigma$ is a sigma algebra of events E, with $\sigma:\Sigma\to[0,1]$ its associated probability distribution function typically generated by integrating a given probability density function $\rho:\Omega\to[0,1]$ over each relevant E. An analyst responsible for providing a solution $\chi^*$ to this system for a decision-maker should provide the following fundamental information necessary for a rational decision:

(1) the probability that this system has a solution, since if this probability is too low, the decision maker may want to consider preliminary actions that change $\sigma: \Sigma \to [0, 1]$, e.g., by changing $\rho: \Omega \to [0, 1]$; and (2) given that this system has a solution, a certainty when the rank of A is m, the most probable solution(s) $\chi^*$ and related statistics.

Regarding the probability that this system has a solution, it is noted that the consistency event $$C = \{b | b = A\chi \text{ for some } \chi \in \mathfrak{R}^n\},$$

is simply the column space of A for which there are known algorithms that provide a set of basis vectors for C that are computationally conducive to integrating numerically, if not analytically, a given probability density $\rho(b)$ over C to determine the associated consistency probability $\sigma(C)$.

Addressing now the most probable solution, if $\sigma(C) > 0$, simply maximize $\rho(b)$ over the primal vector space $$X = \{x = (\chi, b) \in \mathfrak{R}^{n+m} | [A|-I](\chi, b) = 0\}$$

intersected with C, which is just X itself. The equivalent minimization of $-\rho(b)$ over X is an elementary generalized geometric programming problem whose vector-processing solution via GGP duality involves linear combinations of the rows of $[A|-I]$, rather than the rows of $[A|-b]$ for a particular value of b. A resulting most probable solution $\chi^*$ taken from any optimal solution $(\chi, b)^*$ can be expected to be robust for normal Gaussian probability densities $\rho(b)$, as well as for many other important density types.

Considering now distribution and robust problems in stochastic linear programming with essentially no loss of generality, an illustrative canonical linear optimization problem is set out below.

Primal Problem P(A, b, c, d):

maximize $c^T x + d$ subject to $Ax \leq b$ and $x \geq 0$, wherein A in $\mathfrak{R}^{m \times n}$ is arbitrary but fixed, while b in $\mathfrak{R}^m$, c in $\mathfrak{R}^n$, and d in $\mathfrak{R}$ are all stochastic with (b, c, d) in $\mathfrak{R}^{m+n+1}$ confined to the sample space $\Omega = \mathfrak{R}^{m+n+1}$ for which $\Sigma$ is a given sigma algebra of events E with $\sigma: \Sigma \to [0, 1]$ its associated probability distribution function. This associated probability distribution function is typically generated by integrating a given probability density function $\rho: \Omega \to [0, 1]$ over each relevant E.

An analyst responsible for providing an optimal solution to this primal problem for a decision-maker should provide the following fundamental information necessary for a rational decision:

(1) the probability that Problem P(A, b, c, d) is consistent, since if this probability is too low, the decision maker may want to consider preliminary actions that change $\sigma: \Sigma \to [0, 1]$, e.g., by changing $\rho: \Omega \to [0, 1]$;

(2) given that Problem P(A, b, c, d) is consistent, the conditional probability that Problem P(A, b, c, d) is bounded, e.g., as is likely to be the case for realistic profit-maximization problems; and (3) given that Problem P(A, b, c, d) is both consistent and bounded, the most probable optimal solution(s) $x^*$ and related statistical information.

The probability that Problem P(A, b, c, d) is consistent can be addressed by introducing a slack variable $s \in \mathfrak{R}^m$. The relevant primal consistency event $$C_P = \{(b, c, d) | b = Ax + s \text{ for some } x, s \geq 0; c \in \mathfrak{R}^n; d \in \mathfrak{R}\}$$

is a finitely generated cone for which there are known algorithms that express its vectors in computationally simple ways that are conducive to integrating numerically, if not analytically, given probability densities $\rho(b, c, d)$ over $C_P$ to determine the associated consistency probability a ($C_P$).

The probability that Problem P(A, b, c, d) is both consistent and bounded then can be determined, since it is known from linear optimization duality theory that a consistent Problem P(A, b, c, d) is bounded if, and only if, its linear dual Dual Problem Q(A, b, c, d):

minimize $b^T y + d$ subject to $A^T y \geq c$ and $y \geq 0$, is consistent. A formula for the corresponding dual consistency event $C_Q$ (analogous to the formula above for $C_P$) is utilized, with introduction of a dual slack vector variable $t \in \mathfrak{R}^n$ for Problem Q(A, b, c, d). The resulting formula for $C_Q$ is combined with the formula for $C_P$. The primal consistency and boundedness event $$B = \{(b, c, d) | b = Ax + s \text{ for some } x, s \geq 0;$$
$$c = A^T y - t \text{ for some } y, t \geq 0; d \in \mathfrak{R}\}$$

is another finitely generated cone for which there are known algorithms that express vectors in computationally simple ways that are conducive to integrating numerically, if not analytically, given probability densities $\rho(b, c, d)$ over B to determine the associated boundedness probability $\sigma(B)$.

In summary, the probability $\sigma(E)$ of each of these events E, each a finitely generated cone and hence also a polyhedral cone, can be computed by integrating analytically or numerically an appropriate probability density $\rho(b, c, d)$ over each such cone E. To make these integrations as simple as possible, one of the elementary representations for a given finitely generated cone E can be used. Each such representation consists of unique linear combinations of finitely many elementary basis vectors, for the unique largest subspace of E, plus unique non-negative linear combinations of finitely many extreme recession-direction vectors, for an appropriate finitely generated subcone of E that is pointed.

Regarding the most probable solution, if $\sigma(B) > 0$, then maximize $\rho(b, c, d)$ subject to the linear primal and dual feasibility conditions, as a generalized geometric programming problem whose vector-processing solution via GGP duality produces an optimal solution $(b, c, d)^*$ that then is used to solve the deterministic Primal Problem P(A, b*, c*, d*) by any linear programming method. The resulting most probable solution x* can be expected to be robust for normal Gaussian probability densities $\rho(b, c, d)$, as well as for many other important density types.

The above discussed methodology can be extended to and implemented in other linearly constrained applications resulting in vector parallel processing, including, for example: alternatives to the Dantzig-Wolfe Decomposition Principal; optimal control with linear dynamics and dynamic programming with linear transition equations; Kalman filters and filters of the same general type; and linear complementarity and mixed integer linear programming problems.

The above-discussed methodology can also be extended to general non-linearly constrained convex optimization problems, by the conjugate duality and associated parametric programming and post-optimality analyses for either generalized geometric programming, GGP (including the prototype algebraic GGP case, AGP) or Rockafellar bi-function programming. Additionally, the present disclosure contemplates corresponding approaches for fuzzy optimization methodologies.

The vector processing algorithmic methodology of the present disclosure represents a major advance in numerical solution of general linear and continuously non-linear equilibration and optimization problems, both deterministic and stochastic. By reformulating and transforming signature characteristics of geometric programming, vector parallel processing techniques are made applicable to general linear and continuously-nonlinear algebraic optimization, in a manner that reduces optimization problems to equivalent forms in which convexity, linearity, and separability are utilized in transformed objective and constraint functions having a simple two-term formula, $f(x,y)=\log[c \exp(x)+d \exp(y)]$, in which c and d are non-negative coefficients, and x and y are scalar components of a decision vector variable v constrained to lie in a sub-space V of Euclidean space $\Re^n$ whose dimensions m and n increase with problem size. In this formula, $f(x,y)$ is both convex and asymptotically linear, being the simple linear function $x+\log[c]$ when $d=0$.

This function $f(x,y)$ is essentially separable because the monotonicity of the log function justifies its replacement by the separable function $[c \exp(x)+d \exp(y)]$ when separability is more desirable than near linearity. In this context, general linear optimization can be viewed as the extremely special case when $d=0$ for each function $f(x,y)$. Software for general linear and non-linear applications of the present methodology may include a coded front-end module that accepts as input only a coefficient vector (with components consisting of all of the non-negative coefficients c and d) and an m×n generating or basis matrix (for the sub-space V), whose partitions are compatible with those that are determined by the objective and all of the constraint functions.

Since the Stone-Weirstrause Approximation Theorem and related regression methodology show how to transform all optimization problems with continuous objective and constraint functions (defined on compact domains) into equivalent algebraic optimization problems with only polynomial objective and constraint functions, the GP methodology of the present disclosure actually is much more general and useful when combined with appropriate regression methodology. The vector processing methodology of the present disclosure may be usefully applied to stochastic linear and non-linear optimization, with applicability to continuous optimization problems that have integer decision variables or other non-continuous types of combinatorial constraints.

The methodology of the present disclosure, relying on the hidden linearity and near linear convex separability in algebraic optimization problems, as uncovered, reformulated, and transformed for vector parallel processing and cloud computing, represents a recognition of the true nature of geometric programming, including original prototype GP, algebraic geometric programming (AGP), and its various generalizations, generalized geometric programming (GGP) is further illustrated in the following elementary problem examples. These examples are set out in increasing level of sophistication and abstraction, to show the increasingly subtle signature characteristics of both AGP and GGP.

EXAMPLE 4

The optimal shipment of gravel across a river is desired to be determined. The gravel is shipped on a ferry boat that makes any number of trips, using a custom-designed cylindrical gravel container having a radius $t_1$ in feet (an independent design variable) and a height $t_2$ in feet (an independent design variable). The circular bottom and top members of the container cost \$ A/ft$^2$, and the cylindrical side member costs \$ B/ft$^2$, where A and B are given exogenous parameters. The capital cost therefore is $A2\pi t_1^2+B(2\pi t_1)t_2$. V ft$^3$ of gravel is to be transported, and the ferry costs \$ R/round-trip, where V and R are given exogenous parameters. The operating cost is $R(V/\pi t_1^2 t_2)$.

The problem is to find the design vector variable $t=(t_1, t_2)>0$ that minimizes the total cost $P(t)=c_1 t_1^2+c_2 t_1 t_2+c_3/t_1^2 t_2$ for the given exogenously determined coefficients $c_1=2\pi A$, $c_2=2\pi B$, and $c_3=(RV/\pi)$. Since this objective function $P(t)$ is an algebraic function that can also be expressed as $P(t)=c_1 t_1^2 t_2^0+c_2 t_1^1 t_2^1+c_3 t_1^{-2} t_2^{-1}$ and hence can be represented more concisely by the $$\text{coefficient vector} \qquad \text{exponent matrix}$$
$$c = \begin{pmatrix} c_1 \\ c_2 \\ c_3 \end{pmatrix} \quad \text{and } A = \begin{pmatrix} 2 & 0 \\ 1 & 1 \\ -2 & -1 \end{pmatrix},$$

it is an example of a generalized polynomial with general real exponents. Moreover, since $c=(c_1, c_2, c_3)>0$ and $t=(t_1, t_2)>0$, the objective function $P(t)>0$, even though some of its exponents $a_{ij}$ are not positive, and thus $P(t)$ is a positive polynomial.

At this juncture, the hidden linearity and nearly linear convex separability in $P(t)$ are not yet visible and therefore are still to be uncovered.

One traditional approach for minimizing $P(t)$ directly involves a direct search descent algorithm. This approach requires specific values for $c=(c_1, c_2, c_3)$, and provides an optimal design $t^*=(t^*_1, t^*_2)>0$ and an optimal value $P^*=P(t^*)>0$ that is valid for only a very limited range of the parameter values A, B, R, and V. Another, earlier traditional approach is to minimize $P(t)$ indirectly by finding a solution $t^*$ to the optimality condition $\nabla P(t)=0$, which is the non-linear algebraic system $$2c_1 t_1^1 t_2^0 + 1 c_2 t_1^0 t_2^1 - 2c_3 t_1^{-3} t_2^{-1} = 0$$

$$0 c_1 t_1^2 t_2^{-1} + 1 c_2 t_1^1 t_2^0 - 1 c_3 t_1^{-2} t_2^{-2} = 0.$$

Such non-linear systems usually could not be solved analytically prior to the advent of geometric programming, termed prototype GP (PGP) or algebraic GP (AGP), and usually could be solved only numerically, e.g., by a Newton-Raphson algorithm requiring specific values for $c=(c_1, c_2, c_3)$ and therefore having some of the same disadvantages as the direct approaches.

Traditional numerical approaches do not provide the complete functional dependence of the optimal solution $t^*$ and the optimal value $P^*$ on the parameter values A, B, R, V that is of interest to designers.

The geometric programming approach of the present disclosure replaces the difficult nonlinear optimality condition $\nabla P(t)=0$ by an equivalent linear optimality condition whose solutions are easily obtainable by elementary linear algebra. This involves an initial step of restating $P(t)$ as $P(t)=T_1(t)+T_2(t)+T_3(t)$ to provide an explicit focus on its "terms," $T_1(t)=c_1 t_1^2 t_2^0$ $T_2(t)=c_2 t_1^1 t_2^1$ $T_3(t)=c_3 t_1^{-2} t_2^{-1}$. Next, since the derivative of $tj^{aij}$ for $tj>0$ is simply $aij tj^{aij-1}$, multiplying both sides of the $j^{th}$ component of the equation $\nabla P(t)=0$ by $t_j>0$ for $j=1, 2$ provides the equivalent linear optimality conditions $$2T_1 + 1T_2 - 2T_3 = 0$$

$$0T_1 + 1T_2 - 1T_3 =$$

whose coefficient matrix is simply the transpose $A^t$ of the exponent matrix A, a result that holds for all generalized polynomials $P(t)$, by virtue of elementary algebra and calculus. The linear way in which only the terms Ti of P appear in these reformulated optimality conditions suggests that the focus on finding the optimal solution $(t^*_1, t^*_2)=t^*$ should shift to finding the optimal terms $(T^*_1, T^*_2, T^*_3)=T^*$. However, since this linear optimality condition $A^TT=0$ is necessary but not sufficient in itself to determine $T^*$, another optimality condition is needed. A key to finding an appropriate linear optimality condition is to use the defining equation $P=T_1+T_2+T_3$ and the fact that $P>0$ to infer that $T_1/P+T_2/P+T_3/P=1$. Then, the linear manner in which only the ratios $T_i/P$ appear suggests that the focus on the terms $T=(T_1, T_2, T_3)$ should further shift to the term ratios $$y=(y_1, y_2, y_3) \text{ where}$$

$$y_1=T_1/P \; y_2=T_2/P \; y_3=T_3/P$$

which are simply the fractional parts $y_i$ of the objective value P resulting from its terms $T_i$ respectively. Dividing the equations in optimality condition $A^TT=0$ by $P>0$ shows that the optimal ratio vector $(y^*_1, y^*_2, y^*_3)=y^*>0$ satisfies the orthogonality conditions $$2y_1+1y_2-2y_3=0$$

$$0y_1+1y_2-1y_3=0$$

as well as the normality condition $$y_1+y_2+y_3=1.$$

The linear system consisting of the orthogonality and normality conditions has a unique solution $$y^*_1=1/5 \; y^*_2=2/5 \; y^*_3=2/5$$

showing that an optimally designed cylindrical container always has cylindrical side member costs that are twice the combined circular bottom member and top member costs while being identical to the operating costs, invariant relative to the coefficient vector $c=(c_1, c_2, c_3)$ and hence to the exogenous parameters A, B, V, R.

Other important interpretations of the optimal-ratio vector $y^*$ will become transparent if its specific value (1/5, 2/5, 2/5) is not used while solving for the optimal value $P^*$ and optimal solution $t^*$ by the defining equations $$y^*_1=c_1t_1^2t_2^0/P \; y^*_2=c_2t_1^1t_2^1/P \; y^*_3=c_3t_1^{-2}t_2^{-1}/P.$$

This nonlinear system with the unknowns P and t is a disguised version of an equivalent linear system in the corresponding unknowns log P and log t, and can be obtained simply by equating the logarithm of both sides of each equation, to produce the equivalent log-linear system $$\log P=\log(c_1/y^*_1)+2 \log t_1+0 \log t_2$$

$$\log P=\log(c_2/y^*_2)+1 \log t_1+1 \log t_2$$

$$\log P=\log(c_3/y^*_3)-2 \log t_1-1 \log t_2$$

This system is readily solved by first solving for log P, by multiplying both sides of its three equations by $y^*_1, y^*_2,$ and $y^*_3$ respectively, and adding the results, to yield $$(y^*_1+y^*_2+y^*_3)\log P=y^*_1 \log(c_1/y^*_1)+y^*_2 \log(c_2/y^*_2)+y^*_3 \log(c_3/y^*_3)+(2y^*_1+1y^*_2-2y^*_3)\log t_1+(0y^*_1+1y^*_2-1y^*_3)\log t_2$$

which then reduces to $$\log P=y^*_1 \log(c_1/y^*_1)+y^*_2 \log(c_2/y^*_2)+y^*_3 \log(c_3/y^*_3)$$

by virtue of the normality condition and orthogonality conditions respectively. Exponentiating both sides of this equation and substituting (1/5, 2/5, 2/5) for $y^*$ yields the formula $$P^*=[5/(2^{4/5})](c_1^{1/5})(c_2^{2/5})(c_3^{2/5})$$

wherein $c_1=2\pi A, c_2=2\pi B, c_3=(RV/\pi)$ prior to obtaining a formula for $t^*$. However, substituting the resulting formula for log $P^*$ back into the log-linear system from which it was derived produces an over-determined reduced log-linear system in the unknowns log $t_1$ and log $t_2$ whose unique solution produces, after exponentiation, a formula for $t^*$ in terms of c and hence A, B, R, V.

Post-optimality analysis is now addressed. Since the previously derived entropic formula $$\log P^*=y^*_1 \log(c_1/y^*_1)+y^*_2 \log(c_2/y^*_2)+y^*_3 \log(c_3/y^*_3)$$

implies, by virtue of the invariance of $y^*$ with respect to changes in c, that $$\partial(\log P^*)/\partial(\log c_i)=y^*_i \text{ for } i=1, 2, 3,$$

$y^*$ provides a sensitivity analysis analogous to that provided by the dual optimal solutions $y^*$ in linear programming, whose duality is actually a non-obvious special case of algebraic geometric programming duality. This formula becomes directly meaningful when combined with the chain rule to show that $$\partial P^*/\partial c_i=[P^*][y^*_i][1/c_i] \text{ for } i=1, 2, 3$$

which in turn implies by the multi-variable chain rule that for any exogenous parameter E, such as A, B, R, V, $$\partial P^*/\partial E=P^*\{[y^*_1/c_1](\partial c_1/\partial E)+[y^*_2/c_2](\partial c_2/\partial E)+[y^*_3/c_2](\partial c_2/\partial E)\}$$

In general, for positive polynomial minimization problems with a total number n of terms $T_i$ and with at least one positive solution $y^{30}>0$ to the orthogonality conditions $A^t y=0$, the degree of difficulty=n-(rank A)-1, which is simply the dimension of the solution set for the orthogonality and normality conditions. It is zero for the present example and can remain zero as the problem size, determined mainly by both n and the number m of independent variables $t_j$, increases without bound. Although a complete analytical solution to this positive polynomial minimization example requires only elementary linear algebra because it has zero degree of difficulty, more difficult positive polynomial minimization problems with positive degrees of difficulty can be more easily analyzed and solved using problem reformulations and transformations analogous to those in this simplest zero degree-of-difficulty example.

Regarding problem reformulations, since log tj has played a key role in the solution of this example, it is natural to reformulate this example in terms of new independent variables $$z_j=\log t_j \text{ for } j=1, 2$$

which define one-to-one mappings from $(0+\infty)$ onto $(-\infty+\infty)$ with inverses $$t_j=\exp z_j \text{ for } j=1, 2$$

Substituting $\exp z_j$ for $t_j$ into the defining equation for P(t) and then using the laws of exponents gives the equivalent objective function $$F(z)=c_1 \exp(2z_1+0z_2)+c_2 \exp(1z_1+1z_2)+c_3 \exp(-2z_1-1z_2)$$

which is to be minimized as z varies over all of $\mathfrak{R}^2$, giving rise to optimal solutions $z^*$ in $\mathfrak{R}^2$, if there are any in the general case.

The nature of this formula for F(z) motivates the following linear transformation from z to another new independent vector variable $$x = \begin{pmatrix} x_1 \\ x_2 \\ x_3 \end{pmatrix} = \begin{pmatrix} 2 & 0 \\ 1 & 1 \\ -2 & -1 \end{pmatrix} \begin{pmatrix} z_1 \\ z_2 \end{pmatrix} = Az$$

which gives rise to another equivalent objective function $$G(x) = c_1 \exp(x_1) + c_2 \exp(x_2) + c_3 \exp(x_3)$$

which is a strictly convex and separable exponential function that is to be minimized as x varies over all of the column space X of the exponent matrix A, giving rise to optimal solutions x*, if there are any in the general case.

Finally, since log P, and hence its equivalents log F and log G, plays a key role in the preceding solution of this example, and since the log function is monotone increasing, it is natural to reformulate this objective function G(x) as another equivalent objective function $$g(x) = \log[G(x)] = \log[c_1 \exp(x_1) + c_2 \exp(x_2) + c_3 \exp(x_3)]$$

which is still strictly convex but is now asymptotically linear while being exponentially separable and still to be minimized as x varies over all of the column space X of the exponent matrix A, giving rise to the same optimal solutions x*, if there are any in the general case.

The following theoretical observations and facts are noted: (i) an optimal value P* exists if, and only if, at least one of the other optimal values F*, G*, and g* exists, in which case all of these optimal values exist, and P*=F*=G*=exp g*; (ii) an optimal solution t* exists if, and only if, an optimal solution z* exists, in which case all of the optimal solutions e are in one-to-one correspondence with all of the optimal solutions z*, with the corresponding optimal components satisfying the equations $t^*_j = \exp z^*_j$ for j=1, 2; (iii) an optimal solution x* exists if, and only if, an optimal solution z* exists, in which case each optimal solution z* is a solution to the linear system Az=x* for some optimal x*, and each solution z to such a system Az=x* is optimal; (iv) if an optimal solution x* exists, it is unique because of the strict convexity of g(x), but since the set Z* of all optimal solutions z* is simply the solution set for the resulting unique linear system Az=x*, the optimal solution set Z* is a singleton if, and only if, the exponent matrix A has full column rank, with a corresponding statement being valid for the set T* of all optimal t*; and (v) an optimal solution x* exists if, and only if, there is a positive dual vector $y^+ > 0$ that is in the orthogonal complement $X^\perp$ of X, namely, the solution set Y for the orthogonality conditions.

Concerning computational observations and facts, it is noted that the analytical or numerical minimization of either G(x) or g(x) over the vector space X, the column space of the exponent matrix A, is generally preferred over either the minimization of F(z) over $\Re^m$ or the minimization of P(t) over all t>0. This is due to the fact that X has infinitely many different linear-algebraic representations that provide vector parallel processing as a consequence of the separability of both G and g, whose "convexities" also provide easily computed Legendre-Fenchel conjugate transforms H and h, respectively. Such conjugate transforms play key roles in the construction of geometric programming dual problems that generalize linear programming dual problems in very non-trivial ways, and are at least as useful.

In various aspects, the disclosure relates to computational systems, computer-implemented methods, and computer-readable media for conducting mixed integer linearly constrained convex programming (MILCCP), including applications of such programming to MILCCP applications, e.g., Markowitz portfolio selection, and other applications, in which MILCCP techniques are reduced to unconstrained convex programming.

Such aspects of the disclosure relates to an approach in which a "relaxation" (without the integer constraints) is easily reformulated in a revolutionarily new way as an equivalent convex generalized geometric programming (GGP) problem whose corresponding conjugate dual problem is unconstrained and hence can be solved with any unconstrained convex programming algorithm, after which a "cutting plane" resulting from an easily-computed primal-optimal solution readily produces a "dual-update" that is also unconstrained, and hence solvable without (relatively inefficient) "branching", "bounding", and "cold re-starting". During each such iteration, vector parallel-processing can be used directly, without pre-processing, to solve extra-large-scale or multi-scale problems previously unsolvable in real time. Some related stochastic MILCCP problems can also be solved by this GGP methodology.

Linearly constrained convex programming (LCCP) is illustrated for a canonical LCCP problem with relaxed (and hence no) integer constraints, by Problem P below.

Problem P Minimize f(x) subject to $$Ax = b$$

$$1 \leq x \leq u$$

where $$1 \in \Re^n, u \in \Re^n, A \in \Re^{m \times n}, b \in \Re^m, \text{ and } x \in \Re^n$$

while f is convex on its convex domain $F \subseteq \Re^n$
with
F typically being either $\Re^n$ or restricted by finitely many (desirably 0)
inequalities $r(x) \leq 0$ on convex functions r:R where $R \subseteq \Re^n$
Note: P is in "standard form" when 1=0 and u=+∞,
P can model any LP problem when $f(x) = c^T x + d$ and $F = \Re^n$
or $F = \{x \in \Re^n | 1 \leq x \leq u\}$ The key reformulation is set out below.

Expand $x = (x_1, x_2, \ldots, x_n) \in \Re^n$ into $x = (x_1, x_2, \ldots, x_n, x_{n-1}) \in \Re^{n+1}$ This permits a reformulation of f(x) as the "equivalent"

$$f(x_1, x_2, \ldots, x_n) + 0 x_{n+1} \text{ with domain } F \times \{1\} \subseteq \Re^{n-1}$$

which provides the extremely important reformulation of Ax=b as $$[A | -b]x = 0 \text{ (because } x_{n+1} \in \{1\})$$

Now, defining $$X = \{x \in \Re^{n+1} | [A|-b]x = 0\} \text{—a vector sub-space of}$$
$$\Re^{n+1}$$

completes the key reformulation of Problem P as the following generalized geometric programming GGP
Problem P Minimize $f(x_1, \ldots, x_n) + 0 x_{n+1}$ subject to $$(x_1, \ldots, x_n, x_{n+1}) \in X \cap F \times \{1\}$$

Next, orthogonal complement and conjugate transform operations are performed.
To get the (highly desired) UCP form for the general example P of LCCP, the GGP conjugate dual Q of P is constructed—from the orthogonal complement Y of X and the conjugate transform h:H of $$f(x_1, \ldots, x_n) + 0 x_{n+1} : F \times \{1\}.$$

In particular, $$Y = \{y \in \Re^{n+1} | y = z^T [A|-b] \text{ for some } z \in \Re^m\}$$

(namely the "row space" of $[A|-b]$)

and $$H=\{y\in\Re^{n-1}|\sup_{x\in F\times\{1\}}[y^Tx-f(x_1,\ldots,x_n)-0x_{n+1}]<+\infty\},$$

with $$h(y)=\sup_{x\in F\times\{1\}}[y^Tx-f(x_1,\ldots,x_n)-0x_{n+1}].$$

The GGP conjugate dual Q of P then is addressed.

Problem Q Minimize $h(y)$ subject to $$y\in Y\cap H$$

where $$Y=\{y\in\Re^{n+1}|y=z^T[A|-b]\text{ for some }z\in\Re^m\}$$

(simply the "row space" of $[A|-b]$)

$$h(y)=\sup_{x\in F\times\{1\}}[y^Tx-f(x_1,\ldots,x_n)-0x_{n+1}]=\sup_{x\in F}[\Sigma_1^n y_j x_j - f(x_1,\ldots,x_n)]+y_{n+1}\text{ when}$$

$(y_1,\ldots,y_n)\in$ domain D of conjugate transform of $f:F$ $$H=\{y\in\Re^{n-1}|(y_1,\ldots,y_n)\in D\text{ and }y_{n+1}\in\Re^1\}$$

with $H=\Re^{n+1}$ when $D=\Re^n$ ➔ vector-processing

A key corollary of the foregoing is therefore derivable. Given that $0\in(\text{int }H)$, Problem Q is super consistent; but Q is bounded if, and only if, Problem P is consistent—in which case there is no duality gap between P and Q (in that their minima sum to 0). If P is, in fact, consistent, then Q has a non-empty optimal solution set T*; and there is an optimal solution x* to P that is a "sub gradient" of $h(y)$ at a y* in T*—with this x* actually being the gradient $\nabla h(y^*)$ when h is differentiable at y*.

As a key observation, if each component $u_j$ of u is initially chosen to be at least as large as an estimated optimal value $x^*_j$ of $x_j$ for $j=1, 2, \ldots, n$), then $D=\Re^n$ and hence $0\in(\text{int }H)$ ➔ vector-processing.

Summarizing the foregoing methodology, the relaxed problem P (without the integer constraints) is solved by solving its GGP dual Q.

1. If the integer constraints are satisfied by a gradient (or sub-gradient) x* of $h(y^*)$ for a y* in T*, the original MILCCP problem has been solved by x*.
2. If the integer constraints are not satisfied by x*, then compute a "cutting plane" and use its data to attach an additional $\text{row}_{m+1}$ to $[A|-b]$ while also attaching an additional component $z_{m+1}$ to z.
3. Use a "hot start" at $(z^*_1, z^*_2, \ldots, z^*_m, 0)$ to begin solving the new GGP dual $Q_2$, and repeat as necessary to obtain a solution.

The linear programming case is summarized below.

Choose $F=\{x\in\Re^n|1\leq x\leq u\}$ and $f(x)=c^Tx+d$

Then, $H=\Re^{n+1}$ and $$h(y)=[\Sigma_1^n \max\{1_j(y_j-c_j), u_j(y_j-c_j)\}]+y_{n+1}-d$$

The resulting Problem Q has as its objective function this convex piece-wise linear (with 2n pieces) function $h(y)$ that can, of course, be reformulated as a purely linear function in a usual way (by introducing n additional decision variables). Since $H=\Re^{n+1}$ and hence $0\in(\text{int }H)$, vector-processing can be exploited.

In a specific aspect, the disclosure contemplates a methodology of reducing dynamic convex programming with linear transition equations (DCPwLTE) to unconstrained convex programming with vector processing (UCPwVP).

In this methodology, the resulting UCPwVP algorithm for DCPwLTE consists mainly of iteratively computing linear combinations of the row vectors in a fixed partitioned matrix that describes the linear transition equations. Each such partition actually consists of component row vectors that are all zero—except for the n partitions that are in a one-to-one correspondence with the n "dynamic stages" of the given DCPwLTE problem. Consequently, this algorithm can be greatly accelerated by the "vector-processing" of rows that contain nearly all zeros—greatly reducing the size of Richard Bellman's "curse of dimensionality" for DCPwLTE. Moreover, if the original DCPwLTE objective function is separable into a sum of functions that are in a one-to-one correspondence with the n dynamic stages, then its corresponding UCPwVP objective function (a generalized geometric programming conjugate-dual function) is also separable—and hence can be computed even more efficiently with single parallel-processing of the results of the iterative vector-processing.

The reduction is illustratively described below.

Given a DCPwLTE system that is initially in (vector) "state" $s^1$, a (vector) decision $d^1$ causes a system transition from $s^1$ into the state $$s^2=A_1s^1-B_1d^1$$

where the matrices $A_I$ and B1 are given system matrices. After (n−1) such transitions $$s^k=A_{k-1}s^{k-1}-B_{k-1}d^{k-1}\text{ for }k=2, 3, 4, \ldots, n$$

the resulting column vector variable $$x=[s^1 d^1 s^2 d^2 s^3 d^3 \ldots s^{n-2} d^{n-2} s^{n-1} d^{n-1} s^n]^T$$

clearly satisfies the linear homogeneous system $$Ax=0$$

where $$A=\begin{pmatrix} A_1 & -B_1 & -I_1 & 0 & 0 & 0 & \ldots & \ldots & \ldots & 0 & 0 & 0 & 0 & 0 \\ 0 & 0 & A_2 & -B_2 & -I_2 & 0 & \ldots & \ldots & \ldots & 0 & 0 & 0 & 0 & 0 \\ \ldots & & & & & & & & & & & & & \ldots \\ \ldots & & & & & & & & & & & & & \ldots \\ \ldots & & & & & & & & & & & & & \ldots \\ \ldots & & & & & & & & & & & & & \ldots \\ 0 & 0 & 0 & 0 & 0 & 0 & \ldots & \ldots & \ldots & A_{n-2} & -B_{n-2} & -I_{n-2} & 0 & 0 \\ 0 & 0 & 0 & 0 & 0 & 0 & \ldots & \ldots & \ldots & 0 & 0 & A_{n-1} & -B_{n-1} & -I_{n-1} \end{pmatrix}$$

If x is also required to be in the domain G of a given closed and convex objective function g:G that is to be minimized subject to Ax=0, the most general DCPwLTE problem that can be considered here is presented, as a generalized geometric programming GGP problem.

Primal Problem P: Minimize g(x) for x∈X∩G where the vector space X={x|Ax=0}.

The GGP dual problem is defined in terms of both the orthogonal complement Y of X and the conjugate transform h:H of g:G using the row vector variable $$y=[t^1 e^1 t^2 e^2 t^3 e^3 \ldots t^{n-2} e^{n-2} t^{n-1} e^{n-1} t^n]$$

Dual Problem Q: Minimize h(y) for y∈Y∩H where the vector space Y={y|y=zA for some z} namely, the row space of A. The calculation of zA then can exploit vector processors.

References relevant to the foregoing include Elmor L. Peterson, "Symmetric Duality for Generalized Unconstrained Geometric Programming", SIAM Jour. Applied Math., 19, 487 (1970) and Elmor L. Peterson, "Geometric Programming", SIAM Rev., 19, 1 (1976), reprinted in Advances in Geometric Programming (M. Avriel, Ed.), Plenum Press, 31 (1980), and John Joseph Dinkel, "A Duality Theory for Dynamic Programming Problems via Geometric Programming"—A dissertation (under the guidance of Elmor L. Peterson) submitted to the Northwestern University Graduate School in partial fulfillment of the requirements for a PhD degree in Applied Mathematics, June (1971), the disclosures of which are hereby incorporated herein by reference, in their respective entireties.

The present disclosure thus relates in another aspect to a computer-implemented method for generating a solution output on a graphical user interface or other output component of a programmed vector parallel-processing computer to a mixed integer linearly constrained convex programming (MILCCP) application, wherein the programmed vector parallel-processing computer is programmed to reduce the MILCCP application to an unconstrained convex programming application, and wherein said method comprises automatic operation of the programmed vector parallel-processing computer to reformulate the MILCCP application as an equivalent convex generalized geometric programming (GGP) problem whose corresponding conjugate dual problem is unconstrained, and automatic operation of the programmed computer to solve the GGP problem with an unconstrained convex programming algorithm, by vector parallel-processing.

The output component of the programmed vector parallel-processing computer in such method may comprise a storage component, storage medium, cloud storage capability, or other output retention structure, medium, or capability of appropriate character.

Additional aspects of the disclosure relate to a programmed vector parallel-processing computer programmed to carry out such method, and computer-readable media and processors containing instructions for carrying out such method in a vector parallel-processing computer.

Such method and associated programmed vector parallel-processing computer may for example be directed to Markowitz portfolio selection applications, or other MILCCP applications.

More generally, the vector processing algorithmic methodology described herein can be applied to a wide variety of system modeling and optimization problems, including linear programming as well as nonlinear programming problems, exa-scale generalized geometric programming problems, etc. Illustrative problems include, without limitation: multi-scale climate modeling including land, water, and atmospheric climatological components; modeling of controlled hydrogen fusion; modeling of physiological processes; modeling of nanoscale electronic devices and microelectromechanical systems (MEMS); rational drug design; design of materials such as high temperature superconductors, quantum computing components, structural nanomaterials, etc.; modeling of planetary, interstellar, and galactic systems; design and optimization of particle accelerators; modeling of population dynamics; design of pandemic intervention models; optimization of global supply chains; design of multinational disaster response systems; modeling of seismological activity and events; design and optimization of robotic systems; optimization of resource allocation in resource-constrained environments; political forecasting; modeling combustion energy systems; cosmology applications of modeling dark energy and dark matter interactions and environments; modeling exaJoule-level energy flows; design and optimization of exaFLOP computing systems; modeling of nanoscale sensor monitoring systems, e.g., for applications such as environmental assessment, telecommunications, and health management; as well as real-time solution of numerous other large-scale and multi-scale problems of economic and physical equilibration, profit maximization, and cost minimization that have been previously unsolvable.

Further to the foregoing, additional aspects, features, and embodiments of the disclosure are addressed in the ensuing description.

The present disclosure embodies an advance in the art of geometric programming, which began with a singular focus on optimal design of individual components of systems, and has progressed to the present disclosure of optimal design of entire extra-large-scale and multi-scale systems including numerical simulations of their deterministic or stochastic behavior.

The present disclosure contemplates the use of new geometric programming algorithms that may be suitably implemented as a computer-based system, in computer software that resides on computer readable media, or as methods implemented by such systems and software. Such geometric programming algorithms may for example be implemented by or with parallel processing supercomputers, to enable such supercomputers to more effectively, efficiently, and quickly operate to provide real-time numerical simulations of deterministic or stochastic behavior of both extra-large-scale and multi-scale systems to enable real-time numerical solution of more accurate mathematical models of extremely important predictive and prescriptive problems in fields of science, engineering, industry, business, government, and military applications. These geometric programming algorithms have particular utility for the solution of problems whose mathematical models become usably accurate only when endowed with sufficiently accurate physical and/or political-economic characteristics of relevant global-scale systems in which they reside.

The geometric programming algorithms of the present disclosure reflect qualitative and quantitative exploitations of linearity, convexity, and separability that are hidden in all prototype geometric programming problems, exploitations, such as vector parallel-processing, that are achievable only after uncovering, reformulating, and then translating these hidden properties in unexpected and surprisingly effective ways. Such signature characteristics can be illustrated with simple problem examples that require only the use of elementary differential calculus and linear algebra, as will be evident from the ensuing disclosure.

For example, generalized geometric programming (GGP) utilized for general nonlinear optimization and equilibration applications can be introduced via new solution methodologies in accordance with the present disclosure, which efficiently direct vector parallel-processing in the numerical solution of (i) all linear systems that contain equations and/or inequalities, thereby complementing various extremely restrictive iterative solution methodologies such as the conjugate-gradient method for solving only positive-definite symmetric systems of equations, i.e., systems that exclude inequalities and hence linear-programming problems, and (ii) all linear-programming problems, thereby complementing, if not actually replacing, methodologies such as the simplex method and interior-point methodologies, as well as other methodologies that are in capable of solving many important extra-large-scale linear programming problems in real time.

The new solution methodologies of the ensuing disclosure also provide (a) efficiently direct numerical methods for readily generating cutting planes required to solve integer linear programming problems, without the necessity of using extremely inefficient branching and bounding or cold restarting techniques, (b) new numerical solutions of distribution and robust problems for general stochastic linear systems, by deterministic generalized geometric programming that is convex and linearly constrained, and in fact is also simply quadratic when input probability densities are "Gaussian normal" in character, and (c) novel numerical algorithms for readily computing a least-biased probability distribution from both an a priori distribution and statistical information, via scalable vector-processing with parallel-processing supercomputers.

Such new solution methodologies enable solution of extra-large-scale and multi-scale problems, such as: climate simulation and weather prediction, to provide information that may be assistive in the efforts to control climate change; simulation of heavy-hydrogen fusion, toward the goal of enabling safe control of fusion while providing essentially inexhaustible and environmentally benign sources of energy; cosmological simulations such as the evolution of the universe, to facilitate increased understanding of the origin and destiny of the universe; simulations of microeconomic equilibrium, employing linear network models of supply and demand, involving production and/or consumption of goods at spatial and/or temporal nodes as well as trans-shipment and/or storage of goods over links, to advance knowledge of economic systems; and optimization of healthcare delivery systems, to determine trade-offs resulting from the Pareto multi-objective maximization of healthcare effectiveness coupled with minimization of total societal costs.

The present disclosure correspondingly describes computing least-biased probability distributions from statistical information reduced to unconstrained convex minimization via vector-processing scalable at exascale.

By way of historical background, heuristic methodologies such as the completely-unbiased uniform distribution (Ud) were initially advanced as an approach to problems in which a probability distribution cannot be determined with reasonable accuracy from its relevant context. The search for increased accuracy motivated the development of methodologies for various extremely-diversified applications to address the probabilistic bias in such applications, and produced computationally characterized probability distributions that uniquely minimized a precisely-defined divergence function subject to all statistically-determined constraints (S-Dc)s. This special function requires as input only a prior distribution, p, such as the Laplace (Ud) when no other more relevant distribution is known. The (S-Dc)s consist of linear equations that define statistically-determined expectations (S-De)s in terms of given random variables (Rv)s as well as any other given linear moment conditions. The resulting uniquely-optimal solution q is the desired least-biased probability distribution (L-Bd), with q usually being termed the posterior distribution, by virtue of its serving as an improved replacement for the given prior distribution p.

These events were followed by the discovery that if p is the Laplace uniform distribution (Ud), then the resulting q also maximizes the Boltzmann entropy function utilized in the physical sciences of thermodynamics and statistical mechanics. As a consequence, the divergence function is now typically termed the cross-entropy function (C-Ef), which has been successfully minimized in numerical solutions in many moderate-size problems of varying type, including problems in the physical sciences. Despite these advances, there remain a myriad of extremely-large-scale information science problems that heretofore have not been solvable in real time, due primarily to increasingly sophisticated mathematical models being utilized to provide more accurate simulations and optimizations of extremely-diverse globally-large and infinitesimally-small problems. In accordance with the present disclosure, and the approaches described in the ensuing description, such problems are susceptible to solution in real time by vector-processing algorithms that scale at exascale, by transformation of such problems into unconstrained minimization problems that can easily be solved by prototype geometric programming (PGP), involving reformulation of the (S-Dc)s as equations that are homogeneously-linear, the only type of constraint permitted while minimizing the (C-Ef) via PGP. The resulting (L-Bd)s provide important posterior probability inferences q for a variety of the inverse problems that have had central significance within the realm of information science, thermodynamics, and statistical mechanics. A generalization is described hereafter, which accepts statistical information in the form of linear-inequality constraints, and extensions of the ensuing disclosure include generalizations that accept statistical information in the form of algebraically-nonlinear constraints.

Additional approaches of the present disclosure are shown in the following examples.

I. Computing Least-Biased Probability Distributions Using Statistical Information Reduced to Unconstrained Convex Minimization via Vector-Processing Scalable at Exascale Problem P Given a prior probability distribution $$p=(p_1, \ldots, p_n) \text{ for which } p_j>0, j=1, \ldots, n, \text{ and}$$
$$\Sigma_{j=1}^n p_j=1,$$

as well as random variables $R_i=(v_{i1}, \ldots, v_{in})$ with expected values $e_i$, for $i=1, \ldots, m$, minimize the cross-entropy $f(y; p)=\Sigma_{j=1}^n y_j \log(y_j/p_j)$ over all probability distributions $y=(y_1, \ldots, y_n)$ for which $y_j \geq 0$, $j=1, \ldots, n$, and $\Sigma_{j=1}^n y_j=1$ which are further restricted by the additional statistically-determined constraints $$\Sigma_{j=1}^n v_{ij} y_j = e_i, \text{ for } i=1, \ldots, m.$$

Note that each given prior probability $p_j$ must be strictly positive—as in LaPlace's (U d)—but each corresponding variable probability yj can be zero. However, since yj log (yj/pj) in f(y; p) goes to zero as yj>0 goes to zero, defining 0 log(0/pj) to be 0 makes yj log (yj/pj) continuous at yj=0—which implies that f(y; p) is also continuous for all y≥0. Moreover, since the probability constraint $\Sigma_{j=1}^{n} y_j = 1$ must always be satisfied, each statistically-determined constraint $\Sigma_{j=1}^{n} v_{ij} y_j = e_i$, $i=1, \ldots, m$ is clearly equivalent to the corresponding homogeneous constraint $\Sigma_{j=1}^{n} (v_{ij} - e_i) y_j = 0$, $i=1, \ldots, m$.

Consequently, restricting the natural domain y≥0 of the cross-entropy function f(y; p) to the probability-hyperplane $$F = \{y = (y_1, \ldots, y_n) | \Sigma_{j=1}^{n} y_j = 1 \text{ and } y_j \geq 0 \text{ for } j=1, \ldots, n\}$$

reformulates the given cross-entropy problem as

Problem P: Minimize $f(y; p) = \Sigma_{j=1}^{n} y_j \log(y_j/p_j)$ over its domain F subject to the additional statistically-computed homogeneously-linear constraints $$\Sigma_{j=1}^{n} (r_{ij} - e_i) y_j = 0, \text{ for } i=1, \ldots, m.$$

Observation 1: Since it is easy to show that f(y; p) is convex in y with a gradient at y=p of $\nabla_y f(p; p)$ that is simply $(1, \ldots, 1)$, it is not hard to show that p actually minimizes f(y; p) over its entire domain F. These facts show that p is the (L-Bd) when there are no additional constraints of any type, and hence that p satisfies all of the additional constraints, including any that are statistically computed.

Observation 2: If p is actually the "uniform distribution" $(1/n, \ldots, 1/n)$, then $$f(y; p) = \Sigma_{j=1}^{n} y_j \log(ny_j) = [\Sigma_{j=1}^{n} y_j] \log(n) + \Sigma_{j=1}^{n} y_j \log(y_j) = \log(n) + \Sigma_{j=1}^{n} y_j \log(y_j)$$

which shows that maximizing the "entropy" function— $\Sigma_{j=1}^{n} y_j \log(y_j)$ also minimizes the cross-entropy function f(y; p) when $p = (1/n, \ldots, 1/n)$, which is frequently the case in applications involving the physical sciences.

Observation 3: Although the probability domain $$F = \{y = (y_1, \ldots, y_n) | \Sigma_{j=1}^{n} y_j = 1 \text{ and } y_j \geq 0 \text{ for } j=1, \ldots, n\}$$

has an interior-point $(y_1, \ldots, y_n) > 0$ such as $(1/n, \ldots, 1/n)$, the intersection of F with the solution set for the other constraints $$\Sigma_{j=1}^{n} (r_{ij} - e_i) y_j = 0, i=1, \ldots, m$$

of Problem P might not have an interior-point. In particular, if there is a particular index j in $\{1, \ldots, n\}$ for which $y_j = 0$ for each feasible solution y to Problem P, outcome j can obviously never occur, and hence should clearly be eliminated from the sample space S. Then, the resulting Problem P will have at least one feasible solution $$y = (y_1, \ldots, y_n) \text{ for which } \Sigma_{j=1}^{n} y_j = 1 \text{ and } y_j > 0 \text{ for } j=1, \ldots n,$$

where this integer n is smaller than the original n, but all other relationships are unchanged.

Such a Problem P with a feasible interior-point $(y_1, \ldots, y_n) > 0$ is termed canonical and can actually be interpreted as the PGP dual problem for unconstrained posynomial minimization. In particular, the posynomial coefficients $c_i$ are actually the prior probabilities $p_j$—while the exponent matrix $A = [a_{ij}]$ is actually the transpose of the matrix whose elements are the homogeneously-linear constraint coefficients $(r_{ij} - e_i)$. Consequently, the (Generalized) (G)GP dual for this GGP primal problem is actually the extremely-important transformed version of posynomial minimization that is stated here as Problem D: Minimize $g(x; p) = \log[\Sigma_{j=1}^{n} p_j \exp(x_j)]$ over its natural domain $G = \Re^n$ subject only to the statistically-determined linear-composition constraints $$x_j = \Sigma_{i=1}^{m} z_i (r_{ij} - e_i) \; j=1, \ldots, n \text{ where } z \text{ varies over all of } \Re^m.$$

The natural-logarithmic function "log" appearing in this defining formula for g(x; p) is a monotone-increasing function. Numerical minimizations of g(x; p) can be performed most easily and most efficiently by simply minimizing the strictly-convex and separable function $g(x; p) = [\Sigma_{j=1}^{n} p_j \exp(x_j)]$ over its natural domain $G = \Re^n$ while being constrained by the linear transformation $x = zT$ whose (m×n) matrix T has the elements $t_{ij} = (r_{ij} - c_i)$ for $i = 1, \ldots, m$ and $j = 1, \ldots, n$, which conveniently enforces the linear-composition constraints given in Problem D.

The unique optimal solution $x^* = z^* T$ to Problem D actually produces the posterior distribution d, whose component $d_j$ is simply $$p_j \exp(x^*_j) / [\Sigma_{j=1}^{n} p_j \exp(x^*_j)] \text{ for } j=1, \ldots, n.$$

The separable nature of the formula for computing g(x; p) along with the possibility of using vector-processing for computing $x = zT$ from each z in $\Re^m$ is the key to exploiting massively-parallel-processing supercomputers with scaling at exa-scale.

II. Markowitz-Investment Portfolios Numerically Computed with Scalable Vector-Processing, Utilizing Generalized Geometric Programming Conjugate-Duality Given a total budget of $ b>0 that is to be invested during a given time-period in a portfolio consisting of n different securities $S_1, S_2, \ldots, S_n$ a feasible investment (strategy)

$q = (q_1, q_2, \ldots, q_n)$ actually consists of n single investments $ $q_j \geq 0$ each in the corresponding security $S_j$ for $j=1, 2, 3, \ldots, n$ all of which jointly satisfy the budget constraint $\Sigma_1^n q_j = b.$ Assuming that both b and each $q_j$ can be fractions (not limited to be integers), there will clearly be infinitely-many feasible investments q if $n \geq 2$ and $b > 0$—the important case treated herein.

A Markowitz Investment is a feasible investment $q^* = (q^*_1, q^*_2, \ldots, q^*_n)$ with optimality properties that come mainly from statistical information obtained from historical or other sources of data. Such information includes a finite number m of possible outcomes that can be conveniently described by m possible investment returns $R_i = (r_{i1}, r_{i2}, \ldots, r_{in})$ for $i=1, 2, 3, \ldots, m.$ Each individual return $r_{ij} \geq 0$ is just the proportion of the initial feasible investment $q_j \geq 0$ in security $S_j$ that is returned to the investor if possible return $R_i$ actually occurs (at the end of the investment period). In particular, the monetary return from the initial investment $q_j \geq 0$ in $S_j$ is simply $r_{ij} q_j$—which is smaller than $q_j$ if $r_{ij} < 1$, but the same if $r_{ij} = 1$, and larger if $r_{ij} > 1$.

Since the number m of possible returns $R_i$ is assumed herein to be finite (which is typical in realistic financial models), those $R_i$ that cannot possibly occur are obviously not included—so that each included possible return $R_i$ actually occurs with a positive "probability"

$p_i > 0$ for which $\Sigma_1^m p_i = 1$.

Markowitz pioneered the use of this probability information vector $p \in \Re^m$ and the corresponding statistical information matrix $R \in \Re^{m \times n}$ (with m rows and n columns) by numerically maximizing over all feasible q the expected total return $R(q_1, q_2, \ldots, q_n)$ while also numerically minimizing its expected variance $V(q_1, q_2, \ldots, q_n)$—a statistically-accurate measure of the overall volatility and hence risk of the feasible investment q. This probabilistic terminology "expected" simply means a weighted average with the probabilities $p_i > 0$ serving as the weights.

Since maximizing $R(q)$ is clearly equivalent to minimizing $-R(q)$, an investor who has adopted this Markowitz approach can achieve both conceptual and mathematical simplification by thinking in terms of simultaneously minimizing both $-R(q)$ and $V(q)$. This bi-objective minimization can be further transformed into an extremely-informative family of infinitely-many single-objective minimizations that are parameterized by two weights $\alpha \geq 0$ and $\beta \geq 0$ with $\alpha + \beta = 1$ that indicate the relative importance of maximizing $R(q)$ vis-à-vis minimizing $V(q)$.

These single-objective minimizations use the unifying objective-function formula $F(q; \alpha, \beta) = -\alpha R(q) + \beta V(q)$.

Choosing the extreme weights $\alpha = 1$ and $\beta = 0$ clearly produces the largest-possible expected total return $R(q^*)$, while choosing the oppositely-extreme weights $\alpha = 0$ and $\beta = 1$ clearly produces the smallest-possible expected variance $V(q^*)$—namely, the smallest-possible portfolio volatility and hence the smallest-possible portfolio risk.

Choosing one of the infinitely-many other possible values for $\alpha$ and $\beta$ prior to minimizing the corresponding objective function $F(q; \alpha, \beta)$ provides the investor with another of the infinitely-many Markowitz-optimal portfolios $q^* = (q^*_1, q^*_2, \ldots, q^*_m)$. Each of the resulting infinitely-many points with coordinates $R(q^*)$ and $V(q^*)$ in the R-V plane is clearly on a monotone-increasing curve termed the Markowitz-efficient frontier.

The preceding definitions for both the expected total return $R(q)$ and its corresponding expected variance $V(q)$ provide formulas for $R(q)$ and $V(q)$ that can be expressed very simply in terms of the expected return-per-dollar invested in security $S_j$—namely $r_j = \Sigma_1^m p_i r_{ij}$ for $j = 1, 2, 3, \ldots, n$.

In particular, $R(q) = \Sigma_1^m p_i [\Sigma_1^n r_{ij} q_j] = \Sigma_1^n [\Sigma_1^m p_i r_{ij}] q_j = \Sigma_1^n r_j q_j$ while its corresponding expected variance $V(q) = \Sigma_1^m p_i \{[\Sigma_1^n r_{ij} q_j] - R(q)\}^2 = \Sigma_1^m p_i \{\Sigma_1^n (r_{ij} - r_j) q_j\}^2$.

A formal statement of the Markowitz-portfolio optimization problem is now

Problem $P(\alpha, \beta)$: Minimize $F(q; \alpha, \beta) = -\alpha R(q) + \beta V(q)$ over all $q$ for which both $q_j \geq 0$ for $j = 1, 2, \ldots, m$ and $\Sigma_1^n q_j = b$, where $R(q) = \Sigma_1^n r_j q_j$ and $V(q) = \Sigma_1^m p_i \{\Sigma_1^n (r_{ij} - r_j) q_j\}^2$ The mathematical linearity, convexity, and separability hidden within problem $P(\alpha, \beta)$ suggests the following exploitation of generalized geometric programming (GGP).

The hidden linearity can be described most easily in terms of an additional vector variable $x = (x_1, x_2, \ldots, x_{1+m+n})$ that is a linear transformation of $q = (q_1, q_2, \ldots, q_n)$ defined as follows $$\begin{pmatrix} r_1 & \ldots & \ldots & r_j & \ldots & r_n \\ (r_{11} - r_1) & \ldots & \ldots & \ldots & \ldots & (r_{1n} - r_n) \\ (r_{21} - r_1) & \ldots & \ldots & \ldots & \ldots & (r_{2n} - r_n) \\ (r_{31} - r_1) & \ldots & \ldots & \ldots & \ldots & (r_{3n} - r_n) \\ \ldots & \ldots & \ldots & \ldots & \ldots & \ldots \\ \ldots & \ldots & \ldots & \ldots & \ldots & \ldots \\ \ldots & \ldots & \ldots & (r_{ij} - r_j) & \ldots & \ldots \\ \ldots & \ldots & \ldots & \ldots & \ldots & \ldots \\ \ldots & \ldots & \ldots & \ldots & \ldots & \ldots \\ \ldots & \ldots & \ldots & \ldots & \ldots & \ldots \\ (r_{m1} - r_1) & \ldots & \ldots & \ldots & \ldots & (r_{mn} - r_n) \\ 1 & 0 & 0 & 0 & 0 & 0 \\ \ldots & & & & & \ldots \\ \ldots & & & & & \ldots \\ \ldots & & & & & \ldots \\ \ldots & & I \in \Re^{n \times n} & & & \ldots \\ \ldots & & & & & \ldots \\ \ldots & & & & & \ldots \\ \ldots & & & & & \ldots \\ \ldots & & & & & \ldots \\ 0 & 0 & 0 & 0 & 0 & 1 \end{pmatrix} \begin{pmatrix} x_1 \\ x_2 \\ x_3 \\ x_4 \\ \ldots \\ \ldots \\ \ldots \\ \ldots \\ \ldots \\ q_1 \\ q_2 \\ q_3 \\ \ldots \\ \ldots \\ \ldots \\ \ldots \\ \ldots \\ q_n \end{pmatrix} = \begin{pmatrix} \ldots \\ \ldots \\ \ldots \\ \ldots \\ \ldots \\ \ldots \\ \ldots \\ \ldots \\ \ldots \\ \ldots \\ \ldots \\ \ldots \\ \ldots \\ \ldots \\ \ldots \\ \ldots \\ \ldots \\ x_{1+m+n} \end{pmatrix}$$

The objective function $F(q; \alpha, \beta) = -\alpha R(q) + \beta V(q)$ can now be reformulated as the preceding linear transformation $Mq = x$ composed with a simplest type of quadratic, convex, and separable function.

III. Convex Dynamic Programming with Linear Transitions Reduced to Convex Unconstrained Programming Numerically Solvable by Scalable Vector-Processing with Supercomputers This scalable vector-processing algorithm for numerically solving the convex un-constrained programming (CUP) problem resulting from this key reduction of a given convex dynamic programming with linear transitions (CDPwLT) problem consists mainly of iteratively computing appropriate linear combinations of the row vectors in a partitioned matrix that describes the CDPwLT linear transitions (LT). Each such partition consists of row vectors that are all zero—except for the n partitions that describe the n LT. Consequently, this algorithm can be greatly accelerated by vector-processing row vectors that contain nearly all zeros—greatly reducing the exponential curse of dimensionality for CDPwLT that is only partially reduced by Bellman's principle of optimality using a recursive equation. Moreover, if the objective function for a given CDPwLT problem is separable into a sum of n independent functions corresponding to the given n LT, then the actual function to be minimized—a generalized geometric programming (GGP) conjugate-dual function—is also separable and hence can be efficiently evaluated by scalable parallel-processing its independent terms—resulting from the predecessor scalable row-processing.

The Reduction

Given a CDPwLT problem whose system is initially in a state $s^1$ (a finite-dimensional real vector), the subsequent execution of an initial decision $d^1$ (another finite-dimensional real vector) causes an initial linear transition from state $s^1$ into the (finite-dimensional) state $$s^2 = A_1 s^1 - B_1 d^1$$

determined by given system matrices $A_1$ and $B_1$ that are algebraically compatible in size.

Subsequently executing sequential decisions $d^2, d^3, \ldots, d^{(n-1)}$ causes the following (n−1) sequential linear transitions (beginning with the initial decision $d^1$):

$$s^k = A_{k-1} s^{k-1} - B_{k-1} d^{k-1} \text{ for } k=2, 3, 4, \ldots, n$$

which sequentially produce the component vectors of the following column vector variable $$x = [s^1 d^1 s^2 d^2 s^3 d^3 \ldots s^{n-2} d^{n-2} s^n d^{n-1} s^n]^T$$

where $T$ denotes "transpose", and the components $s^k$ and $d^k$ are also column vector variables.

Such a vector x is a system-feasible solution only when it is also in the domain G of a given closed and convex objective function g:G that is to be minimized. In particular, $s^1$ must be within the given starting set $$S = \{s^1 | x = [s^1 d^1 s^2 d^2 s^3 d^3 \ldots s^{n-2} d^{n-2} s^{n-1} d^{n-1} s^n]^T \text{ is system-feasible}\}$$

and $s^n$ must be within the given target set $$T = \{s^n | x = [s^1 d^1 s^2 d^2 s^3 d^3 \ldots s^{n-2} d^{n-2} s^{n-1} d^{n-1} s^n]^T \text{ is system-feasible}\}$$

where the system-feasible solutions x used in defining S and T respectively are independent of each other.

In summary, the given CDPwLT problem is:

Primal Problem P Minimize $g(x)$ for $x \in G$ and $x \in X$ ="null space" of $M$ -where $$M = \begin{pmatrix} A_1 & -B_1 & -I_1 & 0 & 0 & 0 & \ldots & \ldots & \ldots & 0 & 0 & 0 & 0 & 0 \\ 0 & 0 & A_2 & -B_2 & -I_2 & 0 & \ldots & \ldots & \ldots & 0 & 0 & 0 & 0 & 0 \\ \ldots & & & & & & & & & & & & & \ldots \\ \ldots & & & & & & & & & & & & & \ldots \\ \ldots & & & & & & & & & & & & & \ldots \\ \ldots & & & & & & & & & & & & & \ldots \\ 0 & 0 & 0 & 0 & 0 & 0 & \ldots & \ldots & \ldots & A_{n-2} & -B_{n-2} & -I_{n-2} & 0 & 0 \\ 0 & 0 & 0 & 0 & 0 & 0 & \ldots & \ldots & \ldots & 0 & 0 & A_{n-1} & -B_{n-1} & -I_{n-1} \end{pmatrix}$$

Since this closed and convex problem P has a feasible-solution set $G \cap X$ where the set $$X = \{x | Mx = 0\}$$

is clearly a vector sub-space of $\Re^N$ (for some N>>>n), P is, in fact, a generalized geometric programming (GGP) problem which is "consistent" if, and only if, its feasible-solution set $P = G \cap X$ is not empty, which is the main case of interest herein.

Consequently, P has a GGP conjugate-dual problem Q whose objective function h:H is the Legendre-Fenchel-Rockafellar conjugate-transform of g:G and whose vector sub-space of $\Re^N$ is the orthogonal complement Y of X in $\Re^N$—the row space of M.

Dual Problem Q Minimize h(y) for $y \in H$ and $y \in Y$=row space of M

Since $Y = \{y | y = zM \text{ for some } z \in \Re^m\}$ where m is the number of rows in M, scalable vector-processing with supercomputers at exascale computes zM for feasible $z \in \Re^m$.

Its feasible-solution set $Q = H \cap Y$ is not empty in most realistic cases.

The Conjugate Transformation

The conjugate transform h:H of g:G has formulas $$H = \{y \in \Re^N | \sup_{x \in G} [yx - g(x)] < +\infty\} \text{ and } h(y) = \sup_{x \in G} [yx - g(x)] \text{ for each } y \in H.$$

This conjugate (transform) function h:H is always both convex and closed. Such function pairs g:G and h:H are called conjugate functions when g:G is itself both convex and closed, because such a g:G is then also the conjugate transform of h:H—a symmetry echoed by the easily derived conjugate inequality $yx \leq h(y) + g(x)$ for each $x \in G$ and $y \in H$.

Given that $0 \in$ (int H), which is the case when $H = \Re^N$, Problem Q is super consistent, in which case Q is bounded if, and only if, Problem P is consistent—in which case there is no duality gap between P and Q in that their infima sum to 0. In fact if P is consistent and Q is super consistent, then Q has a non-empty optimal solution set Q*, and there is an optimal solution x* to P that is a subgradient of h(y) at a y* in Q*—with this x* actually being the gradient $\nabla h(y^*)$ when his differentiable at y*.

IV. Dynamic Convex Programming with Linear Transition Equations Reduced to Unconstrained Convex Programming with Vector Processing The Unconstrained Convex Programming with Vector Processing (UCPwVP) algorithm for Dynamic Convex Programming with Linear Transition Equations (DCPwLTE) consists mainly of iteratively computing linear combinations of the row vectors in a fixed partitioned matrix that describes the linear transition equations. Each such partition actually consists of component row vectors that are all zero—except for the n partitions that are in a one-to-one correspondence with the n dynamic stages of the given DCPwLTE problem. Consequently, this algorithm can be greatly accelerated by the "vector-processing" of rows that contain nearly all zeros—greatly reducing the size of Bellman's curse of dimensionality for DCPwLTE. Moreover, if the original DCPwLTE objective function is separable into the sum of functions that are in a one-to-one correspondence with the n dynamic stages, then its corresponding UCPwVP objective function (a generalized geometric programming conjugate-dual function) is also separable—and hence can be computed even more efficiently with single parallel-processing of the results of the iterative vector-processing.

The Reduction

Given a DCPwLTE system that is initially in (vector) state $s^1$, a (vector) decision $d^1$ causes a system transition from $s_1$ into the state $$s^2 = A_1 s^1 - B_1 d^1$$

where the matrices $A_1$ and $B_1$ are given system matrices.

After $(n-1)$ such transitions $$s^k = A_{k-1}s^{k-1} - B_{k-1}d^{-1} \text{ for } k=2, 3, 4, \ldots, n$$

the resulting column vector variable $$x = [s^1 d^1 s^2 d^2 s^3 d^3 \ldots s^{n-2} d^{n-2} s^{n-1} d^{n-1} s^n]^T$$

clearly satisfies the linear homogeneous system $$Ax = 0$$

where $$A = \begin{pmatrix} A_1 & -B_1 & -I_1 & 0 & 0 & 0 & \ldots & \ldots & \ldots & 0 & 0 & 0 & 0 & 0 \\ 0 & 0 & A_2 & -B_2 & -I_2 & 0 & \ldots & \ldots & \ldots & 0 & 0 & 0 & 0 & 0 \\ \ldots & & & & & & & & & & & & & \ldots \\ \ldots & & & & & & & & & & & & & \ldots \\ \ldots & & & & & & & & & & & & & \ldots \\ \ldots & & & & & & & & & & & & & \ldots \\ \ldots & & & & & & & & & & & & & \ldots \\ 0 & 0 & 0 & 0 & 0 & 0 & \ldots & \ldots & \ldots & A_{n-2} & -B_{n-2} & -I_{n-2} & 0 & 0 \\ 0 & 0 & 0 & 0 & 0 & 0 & \ldots & \ldots & \ldots & 0 & 0 & A_{n-1} & -B_{n-1} & -I_{n-1} \end{pmatrix}$$

If $x$ is also required to be in the domain G of a given closed and convex objective function $g:G$ that is to be minimized subject to $Ax=0$, we have the most general DCPwLTE problem that can be considered here. It is the generalized geometric programming GGP problem.

Primal Problem P: Minimize $g(x)$ for $x \in X \cap G$ where the vector space $X = \{x | Ax = 0\}$. Its GGP dual problem is defined in terms of both the orthogonal complement Y of X and the "conjugate transform" $h:H$ of $g:G$ using the row vector variable $$y = [t^1 e^1 t^2 e^2 t^3 e^3 \ldots t^{n-2} e^{n-2} t^{n-1} e^{n-1} t^n]$$

Dual Problem Q: Minimize $h(y)$ for $y \in Y \cap H$ where the vector space $Y = \{y | y = zA \text{ for some } z\}$—namely, the "row space" of A.

It is, of course, the calculation of $zA$ that can exploit vector processors.

V. Mixed-Integer Linearly-Constrained Convex Programming MILCCP Reduced to UCP Unconstrained Convex Programming A relaxation (without the integer constraints) is easily reformulated (in a revolutionarily new way) as an equivalent convex Generalized Geometric Programming problem whose corresponding Conjugate Dual problem is unconstrained and hence can be solved with any Unconstrained Convex Programming algorithm—after which a cutting plane resulting from an easily-computed primal-optimal solution readily produces a dual-update that is also unconstrained—and hence solvable without (relatively inefficient) branching, bounding, and cold re-starting. During each such iteration, vector parallel-processing can be used directly (without pre-processing) to solve extra-large-scale or multi-scale problems previously unsolvable in real time. Finally, some related stochastic MILCCP problems can also be solved by this GGP methodology.

Linearly Constrained Convex Programming

A Canonical LCCP Problem with relaxed (and hence no) integer constraints is presented below.

Problem P Minimize $f(x)$ subject to $$Ax = b$$

$$l \leq x \leq u$$

where $l \in \Re^n$, $u \in \Re^n$, $A \in \Re^{m \times n}$, $b \in \Re^m$, and $x \in \Re^n$ while $f$ is convex on its convex domain $F \subseteq \Re^n$ with F typically being either $\Re^n$ or restricted by finitely many (hopefully 0)

inequalities $r(x) \leq 0$ on convex functions $r:R$ where $R \subseteq \Re^n$

Notes: P is in "standard form" when $l=0$ and $u=+\infty$, P can model any LP problem when $$f(x) = c^T x + d \text{ and } F = \Re^n \text{ or } F = \{x \in \Re^n | l \leq x \leq u\}$$

The Key Reformulation

Expand $x = (x_1, x_2, \ldots, x_n) \in \Re^n$ into $x = (x_1, x_2, \ldots, x_n, x_{n+1}) \in \Re^{n-1}$ This permits a reformulation of $f(x)$ as the "equivalent"

$$f(x_1, x_2, \ldots, x_n) + 0x_{n+1} \text{ with domain } F \times \{1\} \subseteq \Re^{n-1}$$

which provides the extremely important reformulation of $Ax = b$ as $[A|-b]x = 0$ (because $x_{n+1} \in \{1\}$)

Now, defining $X = \{x \in \Re^{n-1} | [A|-b]x = 0\}$—a vector sub-space of $\Re^{n+1}$ completes the key reformulation of Problem P as the following Generalized Geometric Programming GGP Problem P Minimize $f(x_1, \ldots, x_n) + 0x_{n+1}$ subject to $(x_1, \ldots, x_n, x_{n+1}) \in X \cap F \times \{1\}$ Orthogonal Complement and Conjugate Transform To get the (highly desired) UCP form for our general example P of LCCP, we construct the GGP conjugate dual Q of P—from the "orthogonal complement" Y of X and the conjugate transform $h:H$ of $f(x_1, \ldots, x_n) + 0x_{n+1}:F \times \{1\}$.

In particular, $Y = \{y \in \Re^{n+1} | y = z^T[A|-b] \text{ for some } z \in \Re^m\}$ (namely the row space of $[A|-b]$)

and $H = \{y \in \Re^{n+1} | \sup_{x \in F \times \{1\}} [y^T x - f(x_1, \ldots, x_n) - 0x_{n+1}]$
$< +\infty\}$, with $h(y) = \sup_{x \in F \times \{1\}} [y^T x - f(x_1, \ldots, x_n) - 0x_{n+1}]$.

GGP Conjugate Dual Q of P

Problem Q Minimize $h(y)$ subject to $y \in Y \cap H$ where $Y = \{y \in \Re^{n+1} | y = z^T[A|-b] \text{ for some } z \in \Re^m\}$ (simply the "row space" of $[A|-b]$)

$h(y)=\sup_{x\in F\times\{1\}}[y^Tx-f(x_1,\ldots,x_n)-0x_{n-1}]=\sup_{x\in F}[\Sigma_1^n y_j x_j-f(x_1,\ldots,x_n)]+y_{n+1}$ when $(y_1,\ldots,y_n)\in$ domain D of conjugate transform of f:F $H=\{y\in\Re^{n+1}|(y_1,\ldots,y_n)\in D \text{ and } y_{n+1}\in\Re^1\}$ with $H=\Re^{n+1}$ when $D=\Re^n$ ➔ vector-processing.

Key Corollary

Given that $0\in$ (int H), Problem Q is "super consistent"; but Q is "bounded" if, and only if, Problem P is "consistent"—in which case there is no "duality gap" between P and Q (in that their minima sum to 0). If P is, in fact, consistent, then Q has a non-empty optimal solution set T*; and there is an optimal solution x* to P that is a "sub gradient" of h(y) at a y* in T*—with this x* actually being the gradient $\nabla h(y^*)$ when h is differentiable at y*.

Note that if each component $u_j$ of u is initially chosen to be at least as large as an estimated optimal value $x^*_j$ of $x_j$ for j=1, 2, . . . , n), then $D=\Re^n$ and hence $0\in$ (int H)➔ vector-processing.

Summary

1. Solve the relaxed problem P (without the integer constraints) by solving its GGP dual Q. If the integer constraints are satisfied by a gradient (or sub-gradient) x* of h(y*) for a y* in T*, the original MILCCP problem has been solved by x*.

2. If the integer constraints are not satisfied by x*, compute a "cutting plane"; and then use its data to attach an additional row$_{m+1}$ to [A|–b] while also attaching an additional component $z_{m+1}$ to z.

3. Use a hot start at $(z^*_1, z^*_2, \ldots, z^*_m, 0)$ to begin solving the new GGP dual $Q_2$. Repeat as needed.

The Linear Programming Case

Choose $F=\{x\in\Re^n|1\leq x\leq u\}$ and $f(x)=c^Tx+d$

Then, $H=\Re^{n+1}$ and $h(y)=[\Sigma_1^n \max\{1_j(y_j-c_j), u_j(y_j-c_j)\}]+y_{n+1}-d$ The resulting Problem Q has as its objective function this convex piece-wise linear (with 2n pieces) function h(y) that can, of course, be reformulated as a purely linear function in the usual way (by introducing n additional decision variables). Since $H=\Re^{n+1}$ and hence $0\in$ (int H), vector-processing can be exploited.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A computer-implemented method generating a numerical solution of a convex programming problem, comprising the computer-implemented steps of:

reformulating the convex programming problem as an equivalent generalized convex programming optimization problem with only linear constraints, and solving the equivalent generalized convex programming optimization problem by vector processing, comprising determining by computer-implemented numerical computation a solution for an unconstrained objective function whose independent vector variable is the generalized convex programming conjugate dual of a primal decision vector variable of the convex programming problem, and comprises a variable linear combination of fixed vectors enabling the vector processing, thereby reducing computational complexity and speeding the computer's numerical computation of the solution;

wherein the convex programming problem is selected from the group consisting of: multi-scale climate modeling; modeling of controlled nuclear fusion; modeling of physiological processes; modeling of nanoscale electronic devices and microelectromechanical systems (MEMS);

pharmaceutical drug design; design of materials selected from the group consisting of high temperature superconductors, quantum computing components, and structural nanomaterials; modeling of planetary, interstellar, and galactic systems; design of particle accelerators; modeling of population dynamics; design of pandemic intervention models; optimization of global supply chains; design of multinational disaster response systems; modeling of seismological activity and events; design and optimization of robotic systems; optimization of resource allocation in resource-constrained environments; political forecasting; modeling of combustion energy systems; modeling of dark energy and dark matter interactions and environments; modeling of exaJoule-level energy flows; design and optimization of exaFLOP computing systems; modeling of nanoscale sensor monitoring systems; and Markowitz portfolio selection; and wherein the method comprises outputting a solution on a graphical user interface or other output component of the computer.

2. The method of claim 1, wherein the convex programming problem comprises at least one of design, modeling, and optimization of a system.

3. The method of claim 2, wherein the system comprises an exa-scale system modeled with at least a million decision variables.

4. The method of claim 1, wherein the convex programming problem comprises a stochastic linear programming optimization problem.

5. The method of claim 1, wherein the convex programming problem comprises multi-scale climate modeling.

6. The method of claim 1, wherein the convex programming problem comprises modeling of controlled nuclear fusion.

7. The method of claim 1, wherein the convex programming problem comprises a problem selected from the group consisting of: economic equilibration, physical equilibration, profit maximization, and cost minimization.

8. The method of claim 1, wherein said solving comprises convex optimization.

9. The method of claim 1, comprising Rockafellar bifunction programming.

10. The method of claim 1, comprising fuzzy optimization.

11. The method of claim 1, wherein the vector processing produces an optimal solution that is used to solve a deterministic primal problem of the convex programming problem by a linear programming method.

12. The method of claim 1, wherein said computer-implemented steps are conducted on a parallel processing computer.

13. A computer-readable storage device embodying a non-transitory program of machine-readable instructions executable by a digital processing apparatus to perform a method of numerical solution of a convex programming problem, the method comprising:

reformulating the convex programming problem as an equivalent generalized convex programming optimization problem with only linear constraints, and solving the equivalent generalized convex programming optimization problem by vector processing, comprising determining by computer-implemented numerical computation a solution for an unconstrained objective function whose independent vector variable is the generalized convex programming conjugate dual of a primal decision vector variable of the convex programming problem, and comprises a variable linear combination of fixed vectors enabling the vector processing;

wherein the convex programming problem is selected from the group consisting of: multi-scale climate modeling; modeling of controlled nuclear fusion; modeling of physiological processes; modeling of nanoscale electronic devices and microelectromechanical systems (MEMS); pharmaceutical drug design; design of materials selected from the group consisting of high temperature superconductors, quantum computing components, and structural nanomaterials; modeling of planetary, interstellar, and galactic systems; design of particle accelerators; modeling of population dynamics; design of pandemic intervention models; optimization of global supply chains; design of multinational disaster response systems; modeling of seismological activity and events; design and optimization of robotic systems; optimization of resource allocation in resource-constrained environments; political forecasting; modeling of combustion energy systems; modeling of dark energy and dark matter interactions and environments; modeling of exaJoule-level energy flows; design and optimization of exaFLOP computing systems; modeling of nanoscale sensor monitoring systems; and Markowitz portfolio selection.

14. The computer-readable storage device of claim 13, selected from the group consisting of random access memory, magnetic data storage diskettes, CD discs, hard drives, RAID arrays, magnetic tape, electronic read-only memory, and optical storage devices.

15. A computer program product comprising a non-transitory computer readable storage medium comprising a computer program enabling numerical solution of a convex programming problem, the computer program comprising:

instructions for reformulating the convex programming problem as an equivalent generalized convex programming optimization problem with only linear constraints, and instructions for solving the equivalent generalized convex programming optimization problem by vector processing, comprising instructions for determining by computer-implemented numerical computation a solution for an unconstrained objective function whose independent vector variable is the generalized convex programming conjugate dual of a primal decision vector variable of the convex programming problem, and comprises a variable linear combination of fixed vectors enabling the vector processing;

wherein the convex programming problem is selected from the group consisting of: multi-scale climate modeling; modeling of controlled nuclear fusion; modeling of physiological processes; modeling of nanoscale electronic devices and microelectromechanical systems (MEMS); pharmaceutical drug design; design of materials selected from the group consisting of high temperature superconductors, quantum computing components, and structural nanomaterials; modeling of planetary, interstellar, and galactic systems; design of particle accelerators; modeling of population dynamics; design of pandemic intervention models; optimization of global supply chains; design of multinational disaster response systems; modeling of seismological activity and events; design and optimization of robotic systems; optimization of resource allocation in resource-constrained environments; political forecasting; modeling of combustion energy systems; modeling of dark energy and dark matter interactions and environments; modeling of exaJoule-level energy flows; design and optimization of exaFLOP computing systems; modeling of nanoscale sensor monitoring systems; and Markowitz portfolio selection.

16. A computer system comprising a memory and parallel processors that are programmatically adapted by the computer program product of claim 15 to generate the numerical solution of the convex programming problem more quickly.

17. The computer system of claim 16, wherein the convex programming problem comprises at least one of design, modeling, and optimization of an exa-scale system.

18. The computer system of claim 17, wherein the convex programming problem comprises a stochastic linear programming optimization problem.

19. A computer-implemented method generating a solution output on a graphical user interface or other output component of a programmed vector parallel-processing computer to a mixed integer linearly constrained convex programming (MILCCP) application, wherein the programmed vector parallel-processing computer is programmed to reduce the MILCCP application to an unconstrained convex programming application, and wherein said method comprises automatic operation of the programmed vector parallel-processing computer to reformulate the MILCCP application as an equivalent generalized convex programming problem whose corresponding conjugate dual problem is unconstrained, and automatic operation of the programmed computer to solve the problem with an unconstrained convex programming algorithm, by vector parallel-processing;

wherein the problem is selected from the group consisting of: multi-scale climate modeling; modeling of controlled nuclear fusion; modeling of physiological processes; modeling of nanoscale electronic devices and microelectromechanical systems (MEMS); pharmaceutical drug design; design of materials selected from the group consisting of high temperature superconductors, quantum computing components, and structural nanomaterials; modeling of planetary, interstellar, and galactic systems; design of particle accelerators; modeling of population dynamics; design of pandemic intervention models; optimization of global supply chains; design of multinational disaster response systems; modeling of seismological activity and events; design and optimization of robotic systems; optimization of resource allocation in resource-constrained environments; political forecasting; modeling of combustion energy systems; modeling of dark energy and dark matter interactions and environments; modeling of exaJoule-level energy flows; design and optimization of exaFLOP computing systems; modeling of nanoscale sensor monitoring systems; and Markowitz portfolio selection.

20. The computer-implemented method of claim 19, wherein the MILCCP application comprises Markowitz portfolio selection.

21. The computer system of claim 16 wherein the memory and parallel processors are part of a massively parallel supercomputer employing a node architecture of interconnected application-specific integrated circuits.

22. The computer system of claim 21 wherein the convex programming problem comprises modeling an exa-scale system.

23. A method of improving operation, for solution of an exa-scale convex programming problem, of a programmable vector processing massively parallel supercomputer, said method comprising providing programmed capability in said programmable vector processing massively parallel supercomputer comprising computer-executable instructions including instructions for reformulating the convex programming problem as an equivalent generalized convex programming optimization problem with only linear constraints, and instructions for solving the equivalent generalized convex programming optimization problem by vector processing;

wherein the convex programming problem is selected from the group consisting of: multi-scale climate modeling; modeling of controlled nuclear fusion; modeling of physiological processes; modeling of nanoscale electronic devices and microelectromechanical systems (MEMS); pharmaceutical drug design; design of materials selected from the group consisting of high temperature superconductors, quantum computing components, and structural nanomaterials; modeling of planetary, interstellar, and galactic systems; design of particle accelerators; modeling of population dynamics; design of pandemic intervention models; optimization of global supply chains; design of multinational disaster response systems; modeling of seismological activity and events; design and optimization of robotic systems; optimization of resource allocation in resource-constrained environments; political forecasting; modeling of combustion energy systems; modeling of dark energy and dark matter interactions and environments; modeling of exaJoule-level energy flows; design and optimization of exaFLOP computing systems; modeling of nanoscale sensor monitoring systems; and Markowitz portfolio selection.

\* \* \* \* \*